(12) United States Patent
Lu et al.

(10) Patent No.: US 11,823,761 B2
(45) Date of Patent: Nov. 21, 2023

(54) PRE-READ IN OPPOSITE POLARITY TO EVALUATE READ MARGIN

(71) Applicant: Micron Technology, Inc., Boise, ID (US)

(72) Inventors: Zhongyuan Lu, Boise, ID (US); Robert John Gleixner, San Jose, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/561,008

(22) Filed: Dec. 23, 2021

(65) Prior Publication Data

US 2023/0207037 A1   Jun. 29, 2023

(51) Int. Cl.
*G11C 29/12* (2006.01)
*G11C 29/42* (2006.01)
*G11C 29/44* (2006.01)

(52) U.S. Cl.
CPC .......... *G11C 29/42* (2013.01); *G11C 29/1201* (2013.01); *G11C 29/12005* (2013.01); *G11C 29/4401* (2013.01)

(58) Field of Classification Search
CPC .............. G11C 29/42; G11C 29/12005; G11C 29/1201; G11C 29/4401
See application file for complete search history.

(56) References Cited

U.S. PATENT DOCUMENTS

| | | | |
|---|---|---|---|
| 9,799,381 B1 | 10/2017 | Tortorelli et al. | |
| 2018/0254090 A1* | 9/2018 | Dutta | ................. G11C 29/021 |
| 2019/0206506 A1* | 7/2019 | Tortorelli | ............ H01L 27/2409 |

* cited by examiner

*Primary Examiner* — Mohammed A Bashar
(74) *Attorney, Agent, or Firm* — Greenberg Traurig

(57) ABSTRACT

Systems, methods, and apparatus to evaluate read margin when reading memory cells in a memory device. In one approach, a controller of a memory device applies an initial read voltage of an initial polarity to memory cells. Errors from the read are used to determine whether read retry is needed. If so, a pre-read voltage of an opposite polarity is applied, and errors determined. Based on the errors from applying the pre-read voltage, a polarity is selected for the read retry voltage. The read retry voltage of the selected polarity is then applied to the memory cells.

27 Claims, 14 Drawing Sheets

PRE-READ IN OPPOSITE POLARITY TO EVALUATE READ MARGIN

FIELD OF THE TECHNOLOGY

At least some embodiments disclosed herein relate to memory devices in general, and more particularly, but not limited to memory devices that apply a pre-read voltage for evaluating read margin when reading memory cells.

BACKGROUND

Memory devices are widely used to store information in various electronic devices such as computers, wireless communication devices, cameras, digital displays, and the like. Information is stored by programming different states of a memory device. For example, binary devices have two states, often denoted by a logic "1" or a logic "0." In other systems, more than two states may be stored. To access the stored information, a component of the electronic device may read, or sense, the stored state in the memory device. To store information, a component of the electronic device may write, or program, the state in the memory device.

Various types of memory devices exist, including magnetic hard disks, random access memory (RAM), read only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), and others. Memory devices may be volatile or non-volatile. Non-volatile memory cells may maintain their stored logic state for extended periods of time even in the absence of an external power source. Volatile memory cells may lose their stored state over time unless they are periodically refreshed by an external power source.

A storage device is an example of a memory device. Typical computer storage devices have controllers that receive data access requests from host computers and perform programmed computing tasks to implement the requests in ways that may be specific to the media and structure configured in the storage devices. In one example, a memory controller manages data stored in memory and communicates with a computer device. In some examples, memory controllers are used in solid state drives for use in mobile devices or laptops, or media used in digital cameras.

Firmware can be used to operate a memory controller for a particular storage device. In one example, when a computer system or device reads data from or writes data to a memory device, it communicates with the memory controller.

Memory devices typically store data in memory cells. In some cases, memory cells exhibit non-uniform, variable electrical characteristics that may originate from various factors including statistical process variations, cycling events (e.g., read or write operations on the memory cells), or a drift (e.g., a change in resistance of a chalcogenide alloy), among others.

In one example, reading a set of data (e.g., a codeword, a page) is carried out by determining a read voltage (e.g., an estimated median of threshold voltages) of memory cells that store the set of data. In some cases, a memory device may include an array of PCM cells arranged in a 3D architecture, such as a cross-point architecture to store the set of data. PCM cells in a cross-point architecture may represent a first logic state (e.g., a logic 1, a SET state) associated with a first set of threshold voltages, or a second logic state (e.g., a logic 0, a RESET state) associated with a second set of threshold voltages. In some cases, data may be stored using encoding (e.g., error correction coding (ECC)) to recover data from errors in the data stored in the memory cells.

For resistance variable memory cells (e.g., PCM cells), one of a number of states (e.g., resistance states) can be set. For example, a single level cell (SLC) may be programmed to one of two states (e.g., logic 1 or 0), which can depend on whether the cell is programmed to a resistance above or below a particular level. As an additional example, various resistance variable memory cells can be programmed to one of multiple different states corresponding to multiple data states, e.g., 10, 01, 00, 11, 111, 101, 100, 1010, 1111, 0101, 0001, etc. Such cells may be referred to as multi state cells, multi-digit cells, and/or multi-level cells (MLCs).

The state of a resistance variable memory cell can be determined (e.g., read) by sensing current through the cell responsive to an applied interrogation voltage. The sensed current, which varies based on the resistance of the cell, can indicate the state of the cell (e.g., the binary data stored by the cell). The resistance of a programmed resistance variable memory cell can drift (e.g., shift) over time. Resistance drift can result in erroneous sensing of a resistance variable memory cell (e.g., a determination that the cell is in a state other than that to which it was programmed, among other issues).

A PCM cell, for example, may be programmed to a reset state (amorphous state) or a set state (crystalline state). A reset pulse (e.g., a pulse used to program a cell to a reset state) can include a relatively high current pulse applied to the cell for a relatively short period of time such that the phase change material of the cell melts and rapidly cools, resulting in a relatively small amount of crystallization. Conversely, a set pulse (e.g., a pulse used to program a cell to a set state) can include a relatively lower current pulse applied to the cell for a relatively longer time interval and with a slower quenching speed, which results in an increased crystallization of the phase change material.

A programming signal can be applied to a selected memory cell to program the cell to a target state. A read signal can be applied to a selected memory cell to read the cell (e.g., to determine the state of the cell). The programming signal and the read signal can be current and/or voltage pulses, for example.

BRIEF DESCRIPTION OF THE DRAWINGS

The embodiments are illustrated by way of example and not limitation in the figures of the accompanying drawings in which like references indicate similar elements.

DETAILED DESCRIPTION

Figure 1:
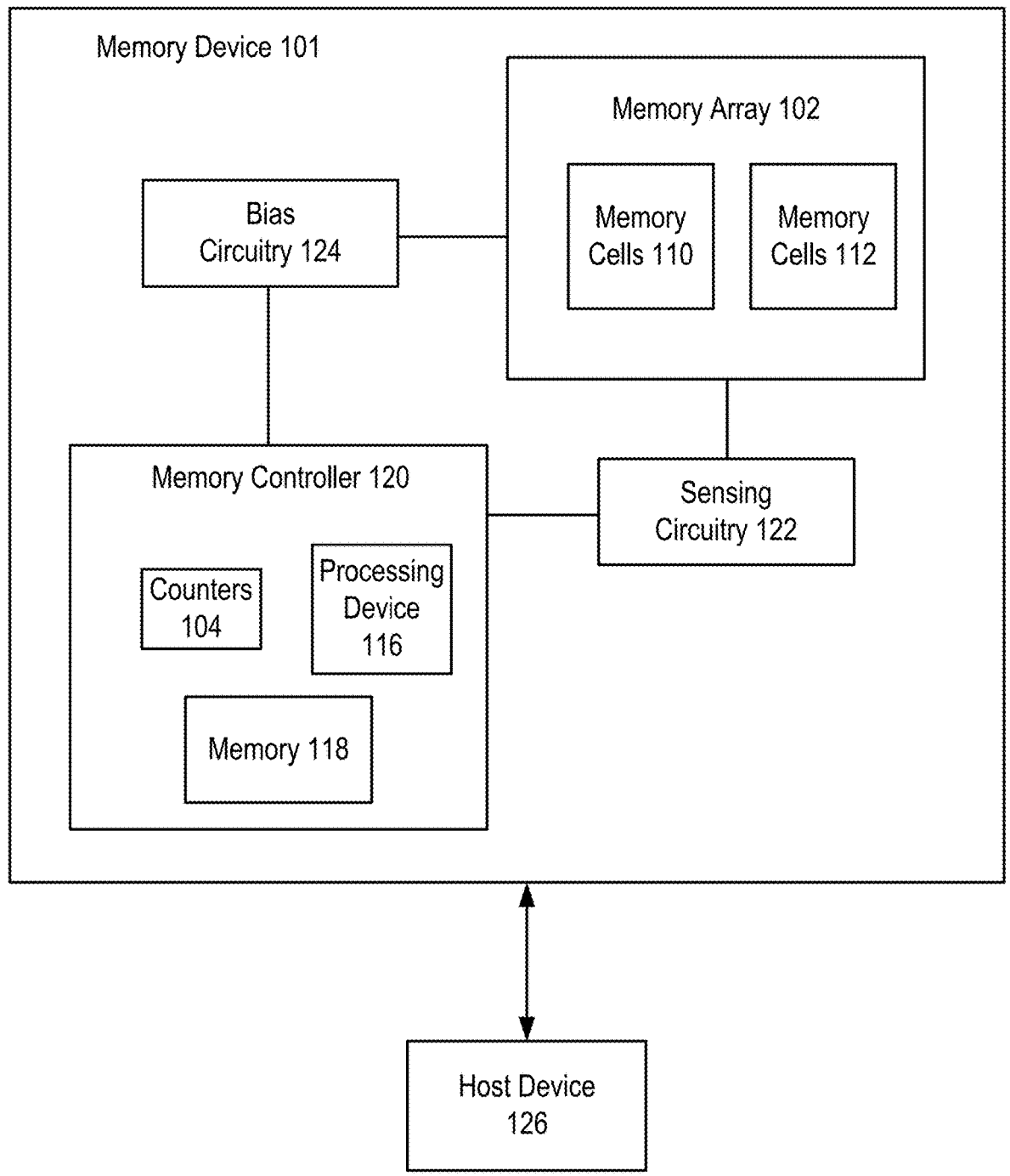
FIG. 1 shows a memory device that applies pre-read voltages to memory cells of a memory array when performing read operations, in accordance with some embodiments.

The following disclosure describes various embodiments for memory devices that apply a pre-read voltage for evaluating read margin when reading memory cells in a memory array (e.g., a three-dimensional cross-point memory array). At least some embodiments herein relate to memory devices that use bipolar operations for a memory array. In one example, bipolar select voltages are used to select memory cells of the memory array. In one example, the memory cells are arranged in a cross-point architecture. In one example, each memory cell is formed using a single select device. In one example, the select device includes a chalcogenide material that snaps when a sufficient voltage is applied across the memory cell.

The memory device may, for example, store data used by a host device (e.g., a computing device of an autonomous vehicle, or another computing device that accesses data stored in the memory device). In one example, the memory device is a solid-state drive mounted in an electric vehicle.

In some cases, a memory device may include an array of memory cells arranged in a three-dimensional (3D) architecture, such as a cross-point architecture, to store the set of data. The memory cells in a cross-point architecture may, for example, represent a first logic state (e.g., a logic 1, a SET state) associated with a first set of threshold voltages, or a second logic state (e.g., a logic 0, a RESET state) associated with a second set of threshold voltages.

In other embodiments, the memory cells may be arranged in a three-dimensional (3D) vertical architecture. A 3D vertical architecture may include memory cells located at the crossing between a vertical access line (e.g., a bit line pillar), and each one of a plurality of second access lines (e.g., word lines), formed in horizontal planes or decks parallel to each other.

It should be noted that, merely for purposes of illustration and discussion, a RESET state is sometimes referred to herein as simply a "RST" state, or indicated by an "RST" notation in the figures.

More generally, an integrated circuit memory cell, such as a memory cell in a cross-point memory or a 3D vertical array, can be programmed to store data by the way of its state at a voltage applied across the memory cell. For example, if a memory cell is configured or programmed in such a state that allows a substantial current to pass the memory cell at a voltage in a predefined voltage region, the memory cell is considered to have been configured or programmed to store a first bit value (e.g., one or zero); and otherwise, the memory cell is storing a second bit value (e.g., zero or one).

Optionally, a memory cell can be configured or programmed to store more than one bit of data by being configured or programmed, for example, to have a threshold voltage in one of more than two separate voltage regions.

The threshold voltage of a memory cell is such that when the voltage applied across the memory cell is increased to above the threshold voltage, the memory cell changes rapidly or abruptly, snaps (e.g., for a chalcogenide memory cell), or jumps from a non-conductive state to a conductive state. The non-conductive state allows a small leak current to go through the memory cell; and in contrast, the conductive state allows more than a threshold amount of current to go through. Thus, a memory device can use a sensor to detect the change, or determine the conductive/non-conductive state of the memory device at one or more applied voltages, to evaluate or classify the level of the threshold voltage of the memory cell and thus its stored data.

The threshold voltage of a memory cell being configured/programmed to be in different voltage regions can be used to represent different data values stored in the memory cell. For example, the threshold voltage of the memory cell can be programmed to be in any of four predefined voltage regions; and each of the regions can be used to represent the bit values of a different two-bit data item. Thus, when given a two-bit data item, one of the four voltage regions can be selected based on a mapping between two-bit data items and voltage regions; and the threshold voltage of the memory cell can be adjusted, programmed, or configured to be in the selected voltage region to represent or store the given two-bit data item. To retrieve, determine, or read the data item from the memory cell, one or more read voltages can be applied across the memory cell to determine which of the four voltage regions contain the threshold voltage of the memory cell. The identification of the voltage region that contains the threshold voltage of the memory cell provides the two-bit data item that has been stored, programmed, or written into the memory cell.

For example, a memory cell can be configured or programmed to store a one-bit data item in a Single Level Cell (SLC) mode, or a two-bit data item in a Multi-Level Cell (MLC) mode, or a three-bit data item in a Triple Level Cell (TLC) mode, or a four-bit data item in a Quad-Level Cell (QLC) mode.

The threshold voltage of a memory cell can change or drift over a period of time, usage, and/or read operations, and in response to certain environmental factors, such as temperate changes. The rate of change or drift can increase as the memory cell ages. The change or drift can result in errors in determining, retrieving, or reading the data item back from the memory cell.

Random errors in reading memory cells can be detected and corrected using redundant information. Data to be stored into memory cells can be encoded to include redundant information to facilitate error detection and recovery. When data encoded with redundant information is stored in a memory sub-system, the memory sub-system can detect errors in data represented by the voltage regions of the threshold voltages of the memory cells and/or recover the original data that is used to generate the data used to program the threshold voltages of the memory cells. The recovery operation can be successful (or have a high probability of success) when the data represented by the threshold voltages of the memory cells and thus retrieved directly from the memory cells in the memory sub-system contains fewer errors, or the bit error rate in the retrieved data is low and/or when the amount of redundant information is high. For example, error detection and data recovery can be performed using techniques such as Error Correction Code (ECC), Low-Density Parity-Check (LDPC) code, etc.

When the data retrieved from the memory cells of the memory sub-system has too many errors for successful decoding, the memory sub-system may retry the execution of the read command. Voltage pulses applied during read retry can cause threshold voltages previously programmed into separate regions to move closer to each other and into a common region and thus reduce the readability of memory cells.

Read retry has been widely used in memory operation systems to perform a re-read operation on a target codeword (CW), with the desired goal of achieving various benefits including error correction, re-programming, etc. More specifically, for chalcogenide memory cells in a cross-point array, read retry with high read voltages (e.g., VDMs) often results in refreshing the SET bits, with the RESET (or simply "RST") bits remaining un-snapped. Reading with higher read voltages (VDMs) could only be triggered with drifted RST states where E3 $V_{th}$ has been high.

Also, while unipolar reads may be typical, applying random polarity reads (e.g., applying read in either negative or positive polarity randomly or iteratively) on a bipolar-type memory array (e.g., using chalcogenide memory cells) can cause continuous refreshing of bits during reads, which might mitigate several key reliability mechanisms (e.g., retention and read disturb on RST). However, using such random polarity reads will refresh the memory cell (e.g., snap a chalcogenide memory cell) in both negative and positive polarities. This could cause drifted SET and refreshed RST states to exist in the same codeword. If so, this causes the technical problem of significantly reducing the read window for the codeword.

In some cases, a read retry may be triggered directly after determining that fails from reading a codeword are beyond an ECC tolerance (e.g., a tolerance threshold). In one example of a codeword (CW) read from a chalcogenide memory array, if a memory device is implementing bipolar read, bits of different states can have been affected by different drift times following prior programming of the bits. Thus, the codeword may have both drifted SET bits and refreshed RST bits in the same polarity (e.g., same negative polarity) at the same time. If this occurs, this causes read margin to collapse for any read retry attempt. If a read retry at a higher VDM is attempted to compensate for SET drift, then RST bits would be snapped in the wrong direction and be disturbed to SET, resulting in the technical problem of uncorrectable fails for the codeword.

As a specific example of this technical problem, consider a codeword that has drifted bits. After a read on positive polarity, the relative positions of threshold voltages for refreshed SET_P (RSTN) bits and drifted RST_P (SET_N) bits has changed (e.g., the RSTN bits are refreshed and move closer to the SET_N bits). Then, consider the adverse result of a read on negative polarity after the foregoing read on positive polarity. More specifically, after doing a read on drifted bits in positive polarity, the read retry margin in the negative polarity will collapse until the RST_N bits there drift away again. During this period, if a read retry in the negative polarity is triggered (e.g., using read voltage VDM2_N because SET_N fails VDM0) to cover the drifted SET_N bits, a large number of RET_N fails will occur (e.g., RST_N cannot tolerate VDM2_N). Further, those RET_N bits will be snapped and disturbed.

Other potential approaches such as using a single read voltage (VDM) to cover the entire retention time range (no retry allowed) also present technical problems. For example, using the single VDM will reduce the allowed threshold voltage (Vth) shift during usage (or conversely increase the window requirement for the memory technology), requiring significant improvements to the memory cell capability for acceptable operability.

To address these and other technical problems (e.g., that may occur in memory devices implementing random polarity read), when a read retry of a specific polarity (sometimes indicated herein as polarity "A") needs to be triggered, a controller first performs a pre-read evaluation on the opposite polarity (sometimes indicated herein as polarity "$\overline{A}$") to ensure that sufficient read-retry margin exists in the target polarity.

Based on the results from the pre-read evaluation, if there is sufficient read margin, the controller performs the read retry in the target polarity (e.g., in the same polarity A). If there is not sufficient read margin, the controller performs the read retry in the opposite polarity (e.g., polarity $\overline{A}$), followed by a re-write (refresh) on the drifted SET bits.

The above re-write (refresh) on the drifted SET bits (in the case where there is not sufficient read margin) better ensures a continuous distribution of SET states at all times during operation of a memory device, and avoids repeated triggering of read retry in continuous read cases.

The above pre-read evaluation in the opposite polarity uses a low read voltage (VDM) to avoid snapping any RST bits if they have sufficient read retry margin. Also, the above approach is compatible for random polarity read of SLC chalcogenide memory cells in cross-point memory devices.

In addition, the above approach can be used for MLC memory cells (which require a double read). For MLC cells, ECC is compared with read results on a most significant bit (MSB) immediately after a first negative polarity read (e.g., $1^{st}$ negative read). Then, read retry can be triggered from a pre-read evaluation as described above, if needed, prior to a second positive polarity read (e.g., $2^{nd}$ positive read) to avoid a read retry window collapsing in both polarities if finishing double reads first.

In various embodiments, a correlation of threshold voltages ($V_{th}$) in opposite polarities for chalcogenide memory cells is used as part of a pre-read evaluation. This correlation permits determining from the pre-read evaluation, for example, the RST threshold voltage ($V_{th}$) range in a negative polarity by reading on the positive polarity.

In one embodiment, a memory device includes a controller and a memory array including chalcogenide memory cells. The controller is configured to: apply a first read voltage [e.g., VDM0_N] of a first polarity [e.g., polarity A] to read the memory cells; determine first errors associated with reading the memory cells using the first read voltage; determine whether the first errors exceed a first threshold [e.g., determine whether read retry is needed]; in response to determining that the first errors exceed the first threshold, apply a second read voltage [e.g., VDM_PRE] of a second polarity [e.g., polarity $\overline{A}$] to read the memory cells [e.g., pre-read], wherein the second polarity is opposite to the first polarity, and a magnitude of the second read voltage is less than a magnitude of the first read voltage; evaluate second errors associated with reading the memory cells using the second read voltage [e.g., pre-read evaluation]; select, based on evaluating the second errors, a third polarity, wherein the third polarity is selected to be the first polarity or the second polarity; and apply a third read voltage [e.g., VDM2_N] of the third polarity to read the memory cells.

Various advantages are provided by embodiments described herein. In one advantage, a read retry is successfully applied in array operation for random polarity reads. Although a write refresh is used on drifted SET bits (otherwise read retry would be triggered every time for reads afterwards until the next write), the above approach can enable random polarity read which provides timely refreshes to the bits to improve the tolerance to mechanisms like retention and read disturb on RST.

Also, once the random polarity read is enabled, due to frequent extra refreshes, the read retry does not need to be triggered as frequently. So, this approach avoids significant additional extra power consumption or worn-out issues. Finally, more E2 margin can be left for the initial read voltage (e.g., VDM0) as compared to using a single VDM readout, so the overall read window budget (RWB) benefits.

FIG. 1 shows a memory device 101 that applies pre-read voltages to memory cells 110, 112 of a memory array 102 when performing read operations, in accordance with some embodiments. Memory device 101 has a memory controller 120 that applies the pre-read voltages. Memory controller 120 includes one or more processing devices 116 and memory 118. In one example, memory 118 stores firmware executed by processing device 116 to apply the pre-read voltages.

Memory controller 120 can use bias circuitry 124 to generate voltages for applying the pre-read and other voltages (e.g., initial read and read retry). Bias circuitry 124 can also generate voltages for applying write voltages to memory cells 110, 112 as part of programming operations. Bias circuitry 124 may also be used to generate read voltages for read operations performed on memory array 102 (e.g., in response to a read command from host device 126).

Memory device 101 includes sensing circuitry 122, which is used to sense a state of each memory cell in memory array 102. In one example, sensing circuitry 122 includes sense amplifiers used to detect a current caused by applying various voltages to memory cells in memory array 102. In one example, bias circuitry 124 applies a pre-read voltage to memory cells 110. Sensing circuitry 122 senses a current associated with each of the memory cells 110 caused by applying the pre-read voltage.

In one example, if sensing circuitry 122 determines that the current for a memory cell is greater than a fixed threshold (e.g., a predetermined level of current), then memory controller 120 determines that the memory cell has snapped.

In one embodiment, memory cells 110 and memory cells 112 correspond to different memory types (e.g., single level cell, or multi-level cell). In one example, the material used to form a select device of each memory cell is different. The pre-read voltage applied to memory cells 110 corresponds to the material used to form memory cells 110. The pre-read voltage applied to memory cells 112 is different and corresponds to the material used to form memory cells 112.

In one embodiment, the controller 120 determines to apply pre-read voltages to memory cells of memory array 102 based on a physical location of the memory cells in the memory array 102. In one example, the physical location is a distance from a row and/or column decoder (e.g., stored in a look-up table in memory 118). In one example, the physical location corresponds to an increased extent of drift or disturb (e.g., as determined from testing during manufacture, and/or sensor or other data during operation). In one embodiment, electrical distance can be additionally and/or alternatively used.

In one embodiment, the controller 120 determines to apply pre-read voltages to memory cells of memory array 102 at least in part based on a level of voltage biases that have previously been applied to particular memory cells in the memory array 102.

In one embodiment, memory controller 120 receives a write command from a host device 126. The write command is accompanied by data (e.g., user data of a user of host device 126) to be written to memory array 102. In response to receiving the write command, controller 120 initiates a programming operation.

In one embodiment, controller 120 uses one of counters 104 to count the number of memory cells that snap as a pre-read voltage is applied. Data stored in counters 104 can be used as part of a pre-read evaluation when determining which polarity to use for applying the read retry voltage. This stored data can optionally be used in combination with error results from ECC of read data when selecting the polarity for the read retry voltage. For example, the stored data and/or ECC results can be provided as inputs to a machine learning model (e.g., artificial neural network) to provide an output of the polarity to use for read retry.

In one example, controller 120 may use write voltages (e.g., write pulses) to write a logic state to a memory cell, such as memory cell 110, 112 during a write operation. The write pulses may be applied by providing a first voltage to a bit line and providing a second voltage to a word line to select the memory cell. Circuits coupled to access lines to which memory cells may be coupled may be used to provide the write voltages (e.g., access line drivers included in decoder circuits). The circuits may be controlled by internal control signals provided by a control logic (e.g., controller 120). The resulting voltage applied to the memory cell is the difference between the first and second voltages. The write pulses may be the same duration as read pulses in some embodiments. In some embodiments the duration is 10-50 ns. In some embodiments, the duration is 1-100 ns. In some embodiments, the duration is 1 ns to 1 microsecond. Writing to the memory cell may take the same time as reading the memory cell in some embodiments.

In one example, the polarity of the read or write pulses may be either a first polarity or a second polarity. For example, a write pulse may apply a voltage to a memory cell in a first polarity (e.g., bit line at 6V and word line at 0V).

In one example, circuits coupled to access lines to which memory cells may be coupled are used to provide read pulses (e.g., access line drivers included in decoder circuits). The circuits may be controlled by internal control signals provided by a control logic (e.g., controller 120). A read voltage or pulse may be a voltage applied to a memory cell for a period of time (e.g., 10-50 ns, 1-100 ns, 1 ns to 1 microsecond). In some embodiments, the read pulse may be a square pulse. In some embodiments, the read pulse may be a ramp, that is, a linearly-increasing voltage may be applied across the memory cell.

In one example, after being accessed (e.g., selected), a memory cell may be read, or sensed, by a sense component (e.g., sensing circuitry 122) to determine the stored state of the memory cell. For example, a voltage may be applied to the memory cell (using a word line and bit line) and the presence of a resulting current may depend on the applied voltage and the threshold voltage of the memory cell. In some cases, more than one voltage may be applied. Additionally, if an applied voltage does not result in current flow, other voltages may be applied until a current is detected by the sense component. By assessing the voltage that resulted in current flow, the stored logic state of the memory cell may be determined. In some cases, the voltage may be ramped up in magnitude until a current flow is detected (e.g., a memory cell turns on, switches on, conducts current, or becomes activated). In other cases, predetermined voltages may be applied sequentially until a current is detected. Likewise, a current may be applied to a memory cell, and the magnitude of the voltage to create the current may depend on the electrical resistance or the threshold voltage of the memory cell.

In some cases, the memory cell (e.g., a PCM cell) includes a material that changes its crystallographic configuration (e.g., between a crystalline phase and an amorphous phase), which in turn, determines a threshold voltage of the memory cell to store information. In other cases, the memory cell includes a material that remains in a crystallographic configuration (e.g., an amorphous phase) that may exhibit variable threshold voltages to store information.

The sense component may include various transistors or amplifiers in order to detect and amplify a difference in the signals. The detected logic state of the memory cell may then be output through a column decoder as output. In some cases, the sense component may be part of a column decoder or a row decoder.

Figure 2:
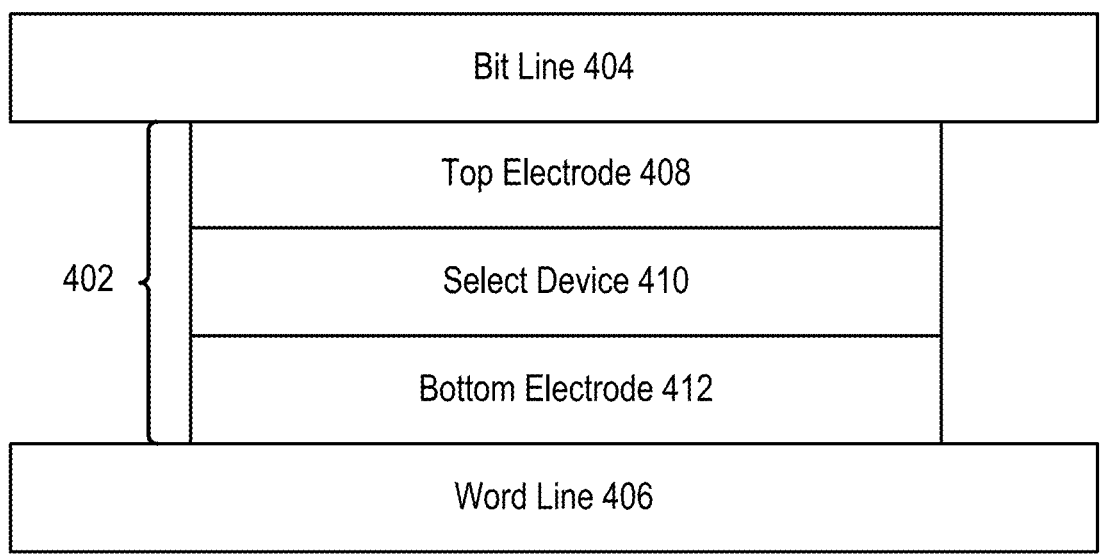
FIG. 2 shows an example of a memory cell that includes a select device, in accordance with some embodiments.

FIG. 2 shows an example of a memory cell 402 that includes a select device, in accordance with some embodiments. In one example, select device 410 includes a chalcogenide. Memory cell 402 is an example of memory cells 110, 112.

Top electrode 408 conductively connects select device 410 to bit line 404, and bottom electrode 412 conductively connects select device 410 to word line 406. In one example, electrodes 408, 412 are formed of a carbon material.

In one example, select device 410 includes a chalcogenide (e.g., chalcogenide material and/or chalcogenide alloy). Threshold voltage properties of the select device may be based on the voltage polarities applied to the memory cell.

In one example, a logic state may be written to memory cell 402, which may correspond to one or more bits of data. A logic state may be read from or written to the memory cell by applying voltages of different polarities at different voltage and/or current magnitudes. The reading and writing protocols may take advantage of different threshold voltages of the select device that result from the different polarities.

Figure 3:
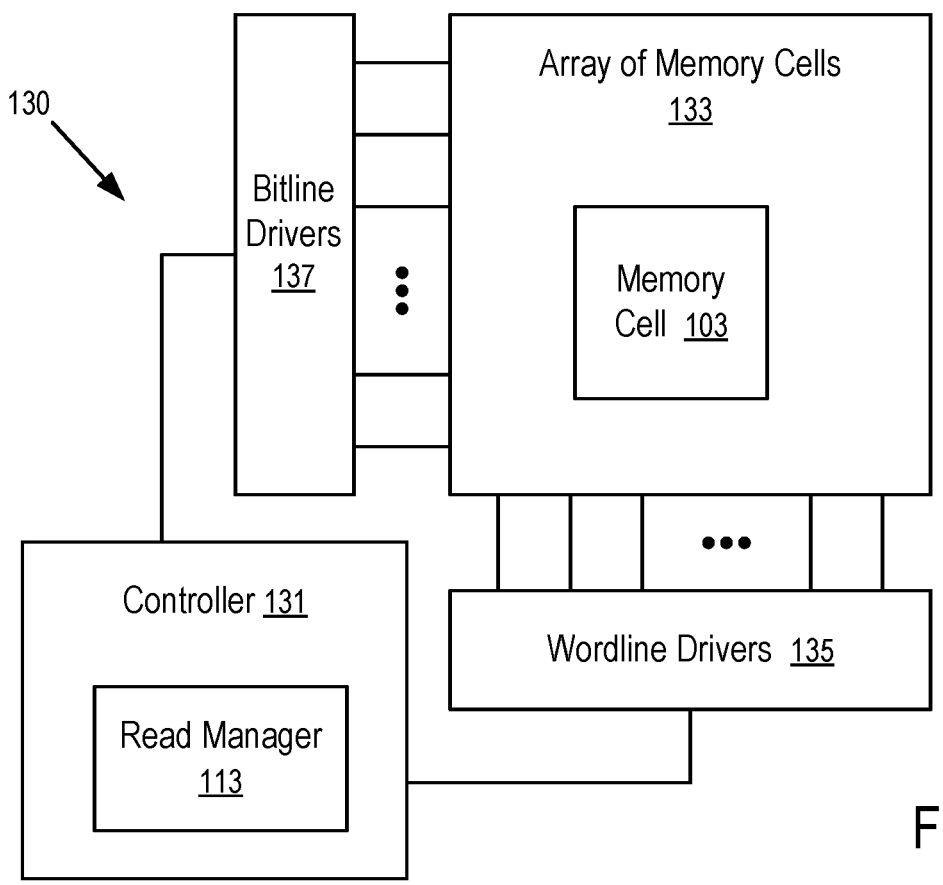
FIG. 3 shows a memory device configured with a read manager according to one embodiment.

FIG. 3 shows a memory device 130 configured with a read manager 113 according to one embodiment. Memory device 130 is an example of memory device 101. In FIG. 3, the memory device 130 includes an array 133 of memory cells, such as a memory cell 103. In one example, an array 133 can be referred to as a tile; and a memory device (e.g., 130) can have one or more tiles. Different tiles can be operated in parallel in a memory device (e.g., 130).

For example, the memory device 130 illustrated in FIG. 3 can have a cross-point memory having at least the array 133 of memory cells (e.g., 103). In another example, the memory device 130 illustrated in FIG. 3 can have a 3D vertical architecture having at least the array 133 of memory cells (e.g., 103).

In some implementations, the cross point memory uses a memory cell 103 that has an element (e.g., a sole element) acting both as a selector device and a memory device. For example, the memory cell 103 can use a single piece of alloy with variable threshold capability. The read/write operations of such a memory cell 103 can be based on thresholding the memory cell 103 while inhibiting other cells in sub-threshold bias, in a way similar to the read/write operations for a memory cell having a first element acting as a selector device and a second element acting as a phase-change memory device that are stacked together as a column. A selector device usable to store information can be referred to as a selector/memory device.

The memory device 130 of FIG. 3 includes a controller 131 that operates bitline drivers 137 and wordline drivers 135 to access the individual memory cells (e.g., 103) in the array 133.

Figure 4:
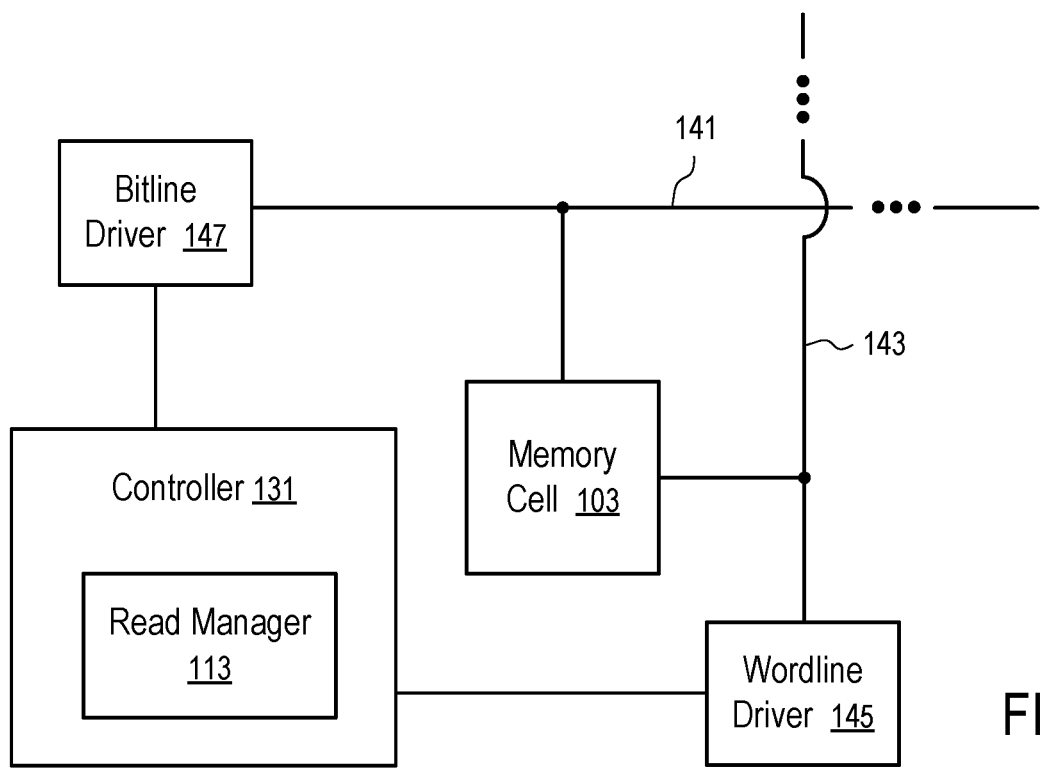
FIG. 4 shows a memory cell with a bitline driver and a wordline driver configured to apply voltage pulses according to one embodiment.

For example, each memory cell (e.g., 103) in the array 133 can be accessed via voltages driven by a pair of a bitline driver 147 and a wordline driver 145, as illustrated in FIG. 4.

The controller 131 includes a read manager 113 configured to implement a process that applies a pre-read voltage for evaluating read margin when reading memory cells. The read manager 113 can be implemented, for example, via logic circuits and/or microcodes/instructions. For example, during a read retry, the read manager 113 uses a read voltage having a magnitude larger than a read voltage previously used to read the memory cell (e.g., 103). The read voltage with the increased magnitude applied to the memory cell (e.g., 103) can be sufficient to obtain the error free data from the memory cell (e.g., 103).

FIG. 4 shows a memory cell 103 with a bitline driver 147 and a wordline driver 145 configured to apply voltage pulses according to one embodiment. For example, the memory cell 103 can be a typical memory cell 103 in the memory cell array 133 of FIG. 3.

The bitline driver 147 and the wordline driver 145 of FIG. 4 are controlled by the read manager 113 of the controller 131 to selectively apply one or more voltage pulses to the memory cell 103. The bitline driver 147 and the wordline driver 145 can apply voltages of different polarities on the memory cell 103.

For example, in applying one polarity of voltage (e.g., positive polarity), the bitline driver 147 drives a positive voltage relative to the ground on a bitline 141 connected to a row of memory cells in the array 133; and the wordline driver 145 drives a negative voltage relative to the ground on a wordline 143 connected to a column of memory cells in the array 133.

In applying the opposite polarity of voltage (e.g., negative polarity), the bitline driver 147 drives a negative voltage on the bitline 141; and the wordline driver 145 drives a positive voltage on the wordline 143.

The memory cell 103 is in both the row connected to the bitline 141 and the column connected to the wordline 143. Thus, the memory cell 103 is subjected to the voltage difference between the voltage driven by the bitline driver 147 on the bitline 141 and the voltage driven by the wordline driver 145 on the wordline 143.

In general, when the voltage driven by the bitline driver 147 is higher than the voltage driven by the wordline driver 145, the memory cell 103 is subjected to a voltage in one polarity (e.g., positive polarity); and when the voltage driven by the bitline driver 147 is lower than the voltage driven by the wordline driver 145, the memory cell 103 is subjected to a voltage in the opposite polarity (e.g., negative polarity).

In some implementations, the memory cell 103 is a self-selecting memory cell implemented using a selector/memory device. The selector/memory device has a chalcogenide (e.g., chalcogenide material and/or chalcogenide alloy). For example, the chalcogenide material can include a chalcogenide glass such as, for example, an alloy of selenium (Se), tellurium (Te), arsenic (As), antimony (Sb), carbon (C), germanium (Ge), and silicon (Si). A chalcogenide material can primarily have selenium (Se), arsenic (As), and germanium (Ge) and be referred to as SAG-alloy. SAG-alloy can include silicon (Si) and be referred to as SiSAG-alloy. In some embodiments, the chalcogenide glass can include additional elements such as hydrogen (H), oxygen (O), nitrogen (N), chlorine (Cl), or fluorine (F), each in atomic or molecular forms.

The selector/memory device has a top side and a bottom side. A top electrode is formed on the top side of the selector/memory device for connecting to a bitline 141; and a bottom electrode is formed on the bottom side of the selector/memory device for connecting to a wordline 143. For example, the top and bottom electrodes can be formed of a carbon material. For example, a chalcogenide material of the memory cell 103 can take the form of a crystalline atomic configuration or an amorphous atomic configuration. The threshold voltage of the memory cell 103 can be dependent on the ratio of the material in the crystalline configuration and the material of the amorphous configuration in the memory cell 103. The ratio can change under various conditions (e.g., having currents of different magnitudes and directions going through the memory cell 103).

A self-selecting memory cell 103, having a selector/memory device, can be programmed to have a threshold voltage window. The threshold voltage window can be created by applying programming pulses with opposite polarity to the selector/memory device. For example, the memory cell 103 can be biased to have a positive voltage difference between two sides of the selector/memory device and alternatively, or to have a negative voltage difference between the same two sides of the selector/memory device. When the positive voltage difference is considered in positive polarity, the negative voltage difference is considered in negative polarity that is opposite to the positive polarity. Reading can be performed with a given/fixed polarity. When programmed, the memory cell has a low threshold (e.g., lower than the cell that has been reset, or a cell that has been programmed to have a high threshold), such that during a read operation, the read voltage can cause a programmed cell to snap and thus become conductive while a reset cell remains non-conductive.

For example, to program the voltage threshold of the memory cell 103, the bitline driver 147 and the wordline driver 145 can drive a pulse of voltage onto the memory cell 103 in one polarity (e.g., positive polarity) to snap the memory cell 103 such that the memory cell 103 is in a conductive state. While the memory cell 103 is conductive, the bitline driver 147 and the wordline driver 145 continue driving the programming pulse to change the threshold voltage of the memory cell 103 towards a voltage region that represents the data or bit value(s) to be stored in the memory cell 103.

The controller 131 can be configured in an integrated circuit having a plurality of decks of memory cells. Each deck can be sandwiched between a layer of bitlines, a layer of wordlines; and the memory cells in the deck can be arranged in an array 133. A deck can have one or more arrays or tiles. Adjacent decks of memory cells may share a layer of bitlines (e.g., 141) or a layer of wordlines (e.g., 143). Bitlines are arranged to run in parallel in their layer in one direction; and the wordlines are arranged to run in parallel in their layer in another direction orthogonal to the direction of the bitlines. Each of the bitlines is connected to a row of memory cells in the array; and each of the wordlines is connected to a column of memory cells in the array. Bitline drivers 137 are connected to bitlines in the decks; and wordline drivers 135 are connected to wordlines in the decks. Thus, a typical memory cell 103 is connected to a bitline driver 147 and a wordline driver 145.

The threshold voltage of a typically memory cell 103 is configured to be sufficiently high such that when only one of its bitline driver 147 and wordline driver 145 drives a voltage in either polarity while the other voltage driver holds the respective line to the ground, the magnitude of the voltage applied across the memory cell 103 is insufficient to cause the memory cell 103 to become conductive. Thus, addressing the memory cell 103 can be performed via both of its bitline driver 147 and wordline driver 145 driving a voltage in opposite polarity relative to the ground for operating/selecting the memory cell 103. Other memory cells connected to the same wordline driver 145 can be de-selected by their respective bitline drivers holding the respective bitlines to the ground; and other memory cells connected to the same bitline driver can be de-selected by their respective wordline drives holding the respective wordlines to the ground.

A group of memory cells (e.g., 103) connected to a common wordline driver 145 can be selected for parallel operation by their respective bitline drivers (e.g., 147) driving up the magnitude of voltages in one polarity while the wordline driver 145 is also driving up the magnitude of a voltage in the opposite polarity. Similarly, a group of memory cells connected to a common bitline driver 147 can be selected for parallel operation by their respective wordline drivers (e.g., 145) driving voltages in one polarity while the bitline driver 147 is also driving a voltage in the opposite polarity.

At least some examples are disclosed herein in reference to a cross-point memory having self-selecting memory cells. Other types of memory cells and/or memory can also be used. For example, memory cells each having a selector device and a phase-change memory device and/or flash memory cells can also be used in at least some embodiments. Additionally or alternatively, the memory can have a different architecture, such as a 3D vertical architecture.

Figure 5:
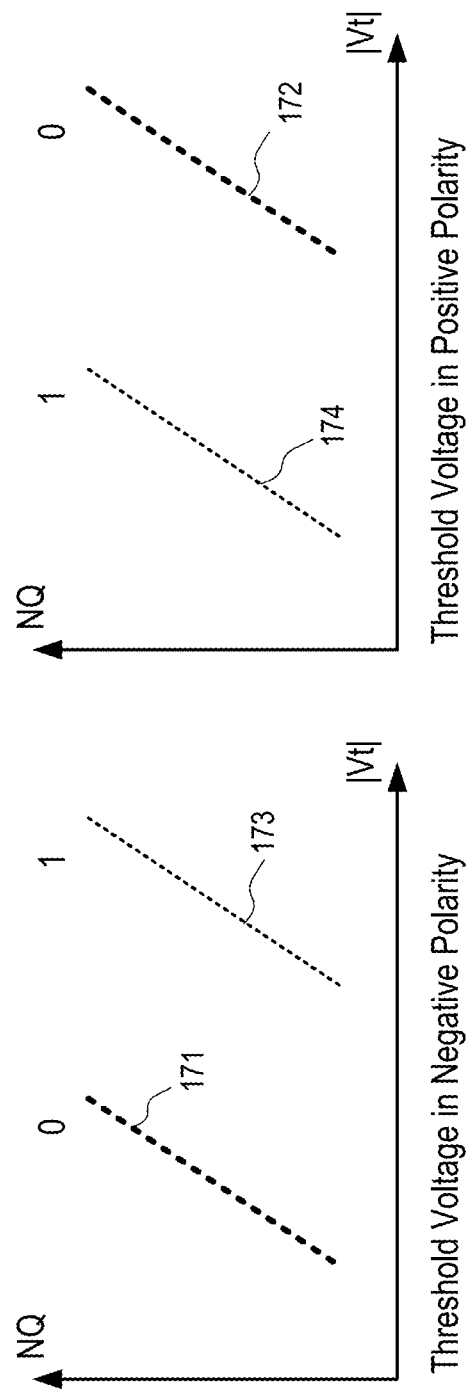
FIG. 5 shows an exemplary normal quantile (NQ) plot representing the statistical distributions of threshold voltages of memory cells.

FIG. 5 shows an exemplary normal quantile (NQ) plot representing the statistical distributions (e.g., 171-174) of threshold voltages of memory cells. In one example, the memory cells are memory cells 110, 112 or 103. When a probability distribution (e.g., 171) of threshold voltages programmed in a region is a normal distribution (also known as Gaussian distribution), its normal quantile (NQ) plot is seen as aligned on a straight line (e.g., distribution 171).

A self-selecting memory cell (e.g., 103) can have a threshold voltage in negative polarity and a threshold voltage in positive polarity. When a voltage applied on the memory cell 103 in either polarity is increased in magnitude up to its threshold voltage in the corresponding polarity, the memory cell (e.g., 103) snaps from a non-conductive state to a conductive state.

The threshold voltage of a memory cell 103 in negative polarity and the threshold voltage of the memory cell 103 in positive polarity can have different magnitudes. Memory cells programmed to have large magnitudes in threshold voltages in positive polarity can have small magnitudes in threshold voltages in negative polarity; and memory cells programmed to have small magnitudes in threshold voltages in positive polarity can have large magnitudes in threshold voltages in negative polarity.

For example, a memory cell can be programmed to have a small magnitude in threshold voltage according to distribution 174 in the positive polarity to represent a value (e.g., one); and as a result, its threshold voltage has a large magnitude according to distribution 173 in the negative polarity to represent the same value (e.g., one). Alternatively, the memory cell can be programmed to have a large magnitude in threshold voltage according to distribution 172 in the positive polarity to represent another value (e.g., zero); and as a result, its threshold voltage has a smaller magnitude according to distribution 171 in the negative polarity to represent the same value (e.g., zero).

Thus, to determine whether a memory cell 103 is storing the one value (e.g., one) or the other value (e.g., zero), the read manager 113 can read the memory cell 103 in either the positive polarity or the negative polarity. If the threshold voltage of the memory cell 103 has a large magnitude according to distribution 172 in the positive polarity, it stores the other value (e.g., zero); otherwise, it stores the one value (e.g., one). Similarly, if the threshold voltage of the memory cell 103 has a large magnitude according to distribution 173 in the negative polarity, it stores the one value (e.g., one); otherwise, it stores the other value (e.g., zero).

The threshold voltage distributions of memory cells may change after a read. For example, in the positive polarity, a read can cause the high magnitude distribution 172 to shift downward, and/or the low magnitude distribution 174 to shift downward.

Similarly, in negative polarity, the read can cause the high magnitude distribution 173 to shift downward, and/or the low magnitude distribution 171 to shift downward.

Figure 6:
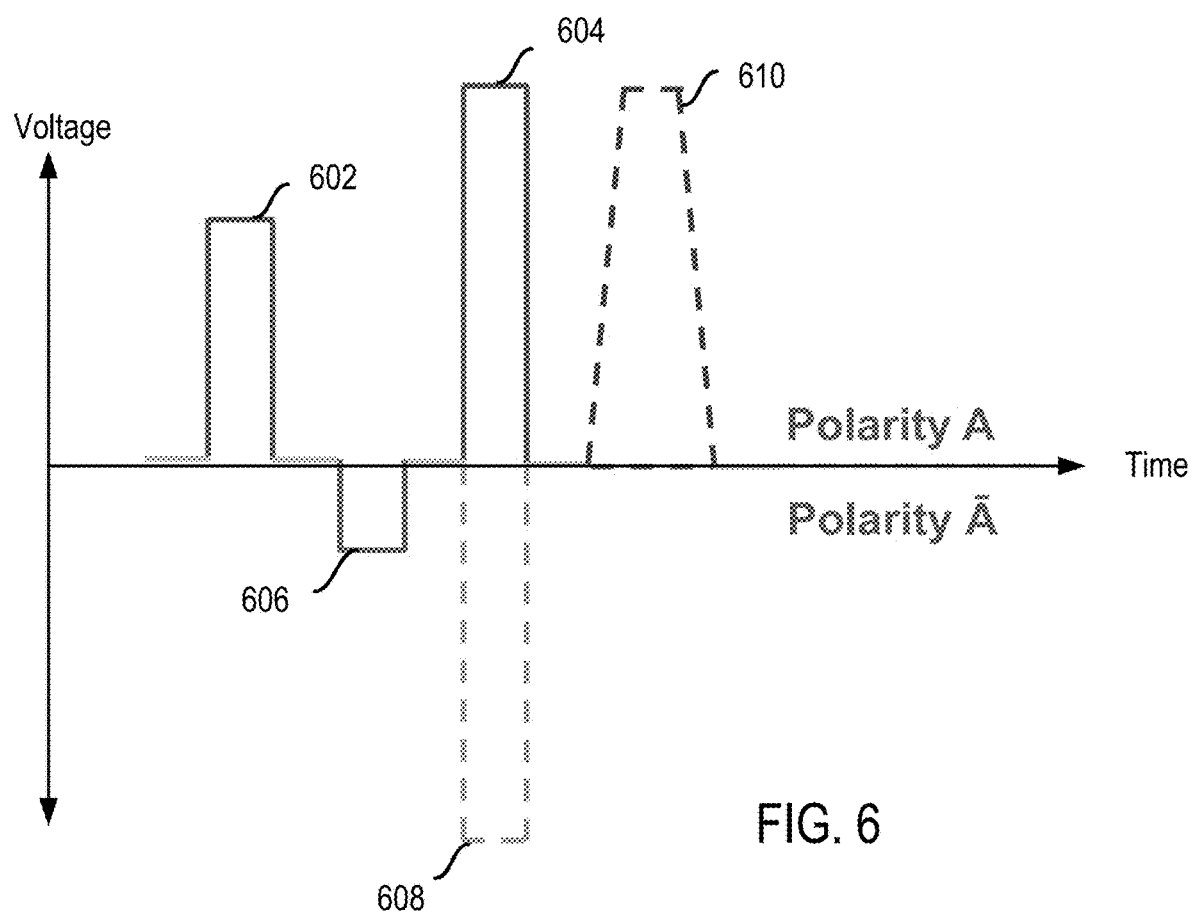
FIG. 6 shows an exemplary graph of voltage vs. time for voltages of positive and negative polarities applied to memory cells during a read operation, in accordance with some embodiments.

FIG. 6 shows an exemplary graph of voltage vs. time for voltages of positive and negative polarities applied to memory cells during a read operation, in accordance with some embodiments. In one example, the voltages are applied by memory controller 120 using bias circuitry 124, or by controller 131 using bitline driver 147 and wordline driver 145.

The magnitude of the applied voltage is indicated on the vertical axis. The polarity of the applied voltage can be polarity A (e.g., negative) or its opposite polarity A (e.g., positive).

In one embodiment, an initial read is performed by applying initial read voltage 602 (e.g., VDM0_N) to one or more memory cells (e.g., bits in a codeword). Errors from the read are determined. If the errors exceed a threshold, then a read retry is required. For the read retry, first a pre-read voltage 606 (e.g., VDM_PRE) of a lower magnitude than voltage 602 is applied to the cells in the opposite polarity. A pre-read evaluation of errors from applying pre-read voltage 606 is used to select a polarity for the read retry voltage.

If errors from the pre-read evaluation are less than a threshold, this indicates that read margin is not sufficient for read retry in the same polarity. So, a read retry voltage 608 of an opposite polarity (e.g., VDM2_P) is applied to read the cells.

If errors from the pre-read evaluation are greater than a threshold, this indicates that read margin is sufficient for read retry in the same polarity. So, a read retry voltage 604 of the same polarity (e.g., VDM2_N) as initial read voltage 602 (e.g., VDM0_N) is applied to read the cells.

If the read margin above was determined to be not sufficient, then following the read retry above, a voltage 610 of the same polarity as initial read voltage 602 is applied to re-write the SET bits (e.g., SET_N) of the same polarity. This is done to restore a read window with sufficient read margin for future incoming reads. This re-writing can be performed based on the feedback data obtained from applying the read retry voltage 608 (e.g., VDM2_P). There is no need to re-write the RST bits of the same polarity.

FIGS. 7-10 show exemplary normal quantile (NQ) threshold voltage distributions of single-level cell (SLC) memory cells for which applying a pre-read voltage indicates that read margin in a negative polarity is not sufficient to perform a read retry in the negative polarity, in accordance with some embodiments. In one example, the SLC memory cells are memory cells 110, 112 or 103. The horizontal axis corresponds to threshold voltages for memory cells in corresponding negative (N) and positive (P) polarities. Distributions are shown for RST and SET memory cells in both polarities. RST_N corresponds to SET_P, and SET_N corresponds to RST_P.

Vertical dashed lines indicate various read voltages that may be applied to the memory cells, as described herein. For example, VDM0_N is an initial read voltage in negative polarity.

Figure 7:
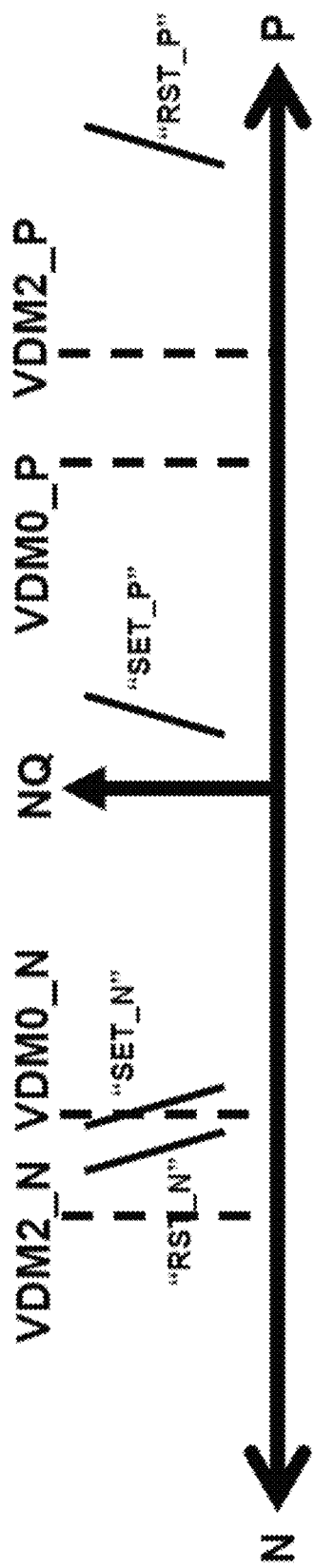
FIGS. 7-10 show exemplary normal quantile (NQ) threshold voltage distributions of single-level cell (SLC) memory cells for which applying a pre-read voltage indicates that read margin in a negative polarity is not sufficient to perform a read retry in the negative polarity, in accordance with some embodiments.

In FIG. 7, the read retry margin in a new negative read out (NEG RO) has collapsed on negative (NEG) polarity following a prior read out on positive polarity (POS RO). Applying an initial read voltage VDM0_N causes ECC errors above a threshold when reading SET_N bits. Thus, a read retry is now needed in the negative read out (NEG RO) to cover the SET_N bits.

Figure 8:
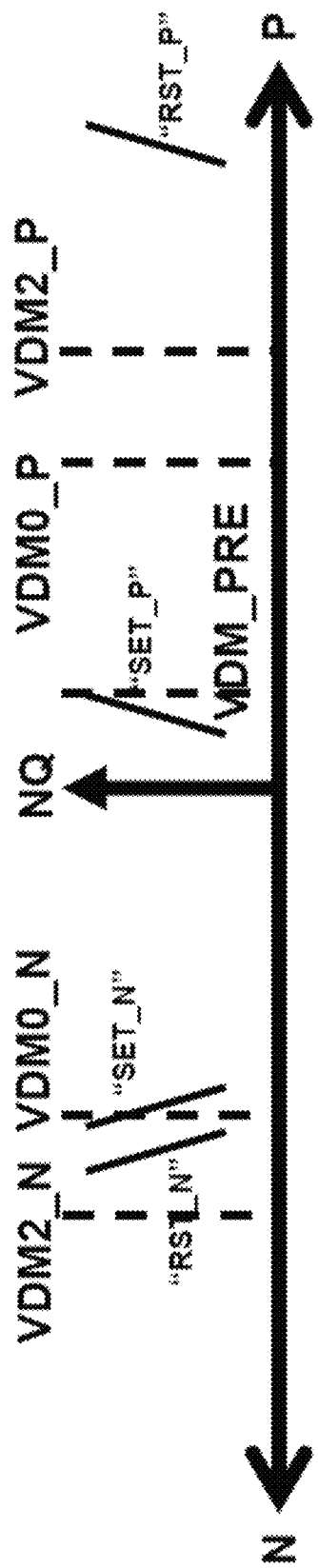

In FIG. 8, a pre-read voltage (VDM_PRE) in positive polarity is applied to evaluate the threshold voltage (Vth) of RST_N on SET_P bits, to determine if enough read retry margin on negative (NEG) polarity exists. The threshold voltages of the SET_P bits are correlated to the threshold voltages of the RST_N bits, and are read using VDM_PRE to obtain an indication of the available read margin on negative polarity.

Figure 9:
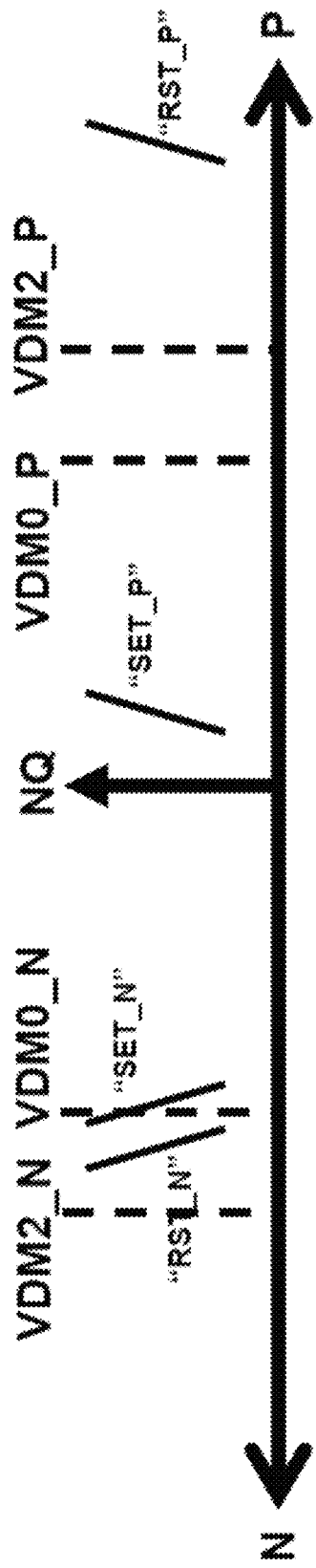

In FIG. 9, read results using VDM_PRE result in a relatively low error rate (e.g., low raw bit error rate/code word failure rate (RBER/CWFR)) of SET_P bits, indicating that the distribution of RST_N bits is at a low threshold voltage range. Since the threshold voltage ($V_{th}$) of RST_P bits is now high, and the threshold voltage ($V_{th}$) of SET_P bits is low, a read retry can be performed on positive (POS) polarity (e.g., using VDM2_P) to obtain correct output data for this read.

Figure 10:
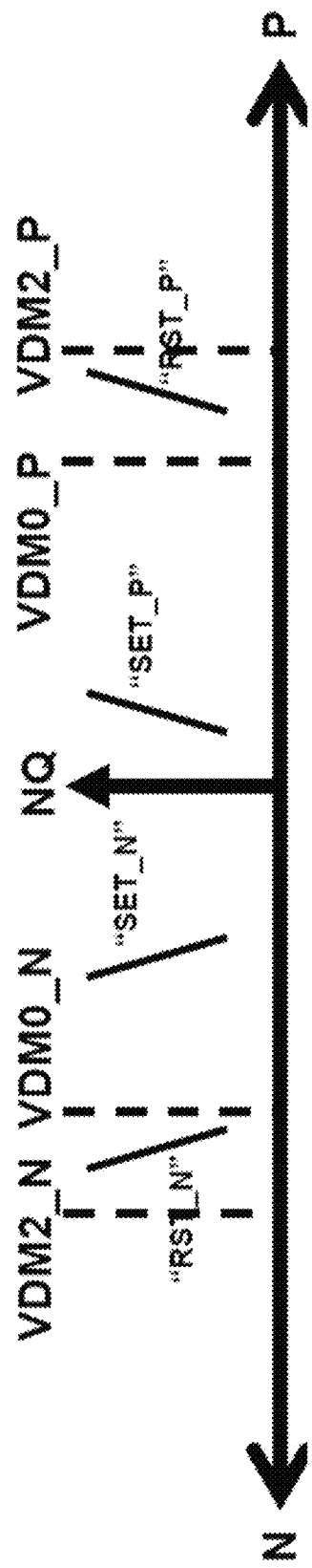

In FIG. 10, after the read retry above, the controller (e.g., 120) also re-writes the RST_P/SET_N bits based on the feedbacks of the above positive read out (POS RO) from applying the read retry voltage. This restores a read window of sufficient read margin for newly-incoming reads.

FIGS. 11-14 show exemplary normal quantile (NQ) threshold voltage distributions of single-level cell (SLC) memory cells for which applying a pre-read voltage indicates that read margin in a negative polarity is sufficient to perform a read retry in the negative polarity, in accordance with some embodiments.

Similarly as for FIGS. 7-10 above, in one example, the SLC memory cells are memory cells 110, 112 or 103. The horizontal axis corresponds to threshold voltages for memory cells in corresponding negative (N) and positive (P) polarities. Distributions are shown for RST and SET memory cells in both polarities. RST_N corresponds to SET_P, and SET_N corresponds to RST_P.

Vertical dashed lines indicate various read voltages that may be applied to the memory cells, as described herein. For example, VDM0_N is an initial read voltage in negative polarity.

Figure 11:
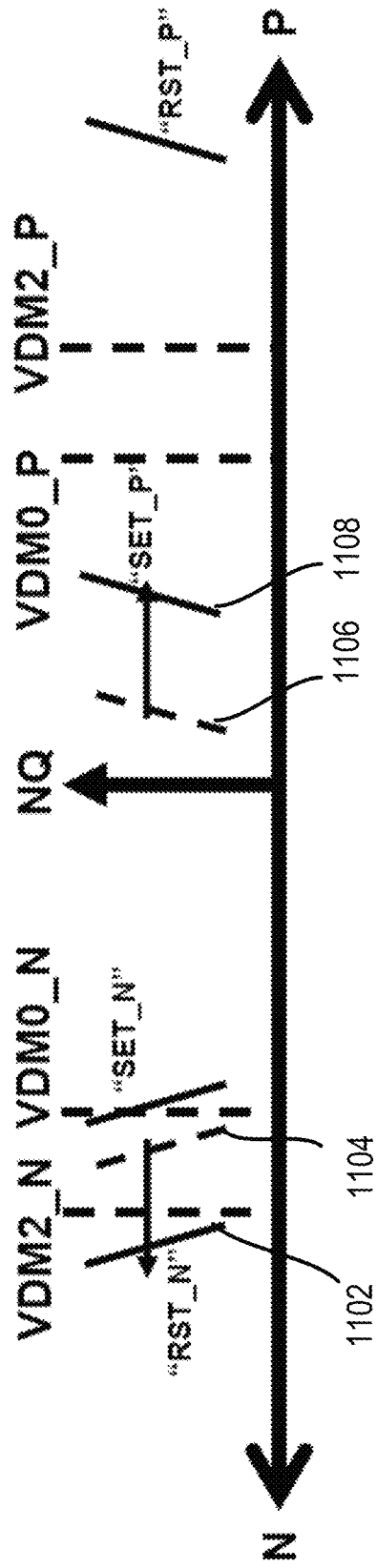
FIGS. 11-14 show exemplary normal quantile (NQ) threshold voltage distributions of single-level cell (SLC) memory cells for which applying a pre-read voltage indicates that read margin in a negative polarity is sufficient to perform a read retry in the negative polarity, in accordance with some embodiments.

In FIG. 11, the distributions for RSTN and SET_P have drifted as indicated by the horizontal arrows (e.g., distribution 1104 has drifted to distribution 1102; and distribution 1106 has drifted to distribution 1108). An initial read voltage (VDM0_N) in negative polarity is applied to read the illustrated SET_N bits. The initial read voltage cannot cover the SET_N bits, and a controller determines that an ECC error rate is above a threshold. Thus, the controller determines that a read retry is required to complete the read operation with sufficiently low error.

Figure 12:
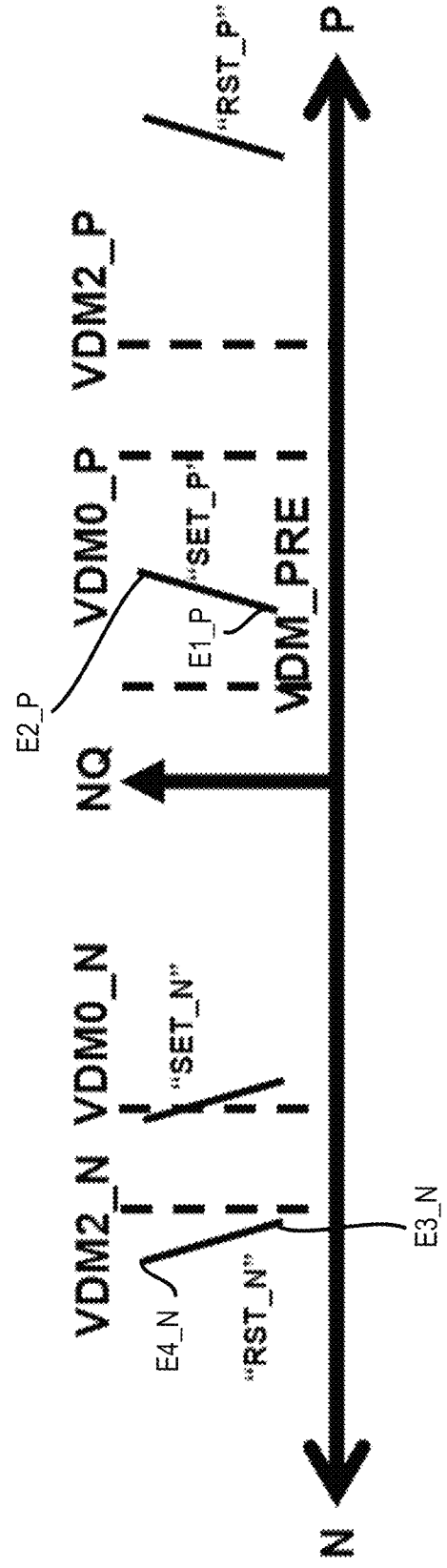

In FIG. 12, a pre-read voltage VDM_PRE in positive polarity is applied to the memory cells. Results from applying the pre-read on positive (POS) polarity indicates that the threshold voltage ($V_{th}$) of distribution edge E1_P as shown is high. This further indicates that the corresponding, correlated threshold voltage of distribution edge E3_N (E3_N $V_{th}$) is also high, and thus enough read margin exists for read retry on negative polarity.

It should also be noted that the magnitude of the pre-read voltage is kept to a low level. For example, VDM_PRE is kept sufficiently low so as not to snap SET_P bits and degrade the negative (NEG) read window (e.g., when E1_P/E3_N Vth is high). For example, the pre-read voltage VDM_PRE is set to a predefined value less than the threshold voltage of edge E1_P (Vth_E1P_Target).

Figure 16:
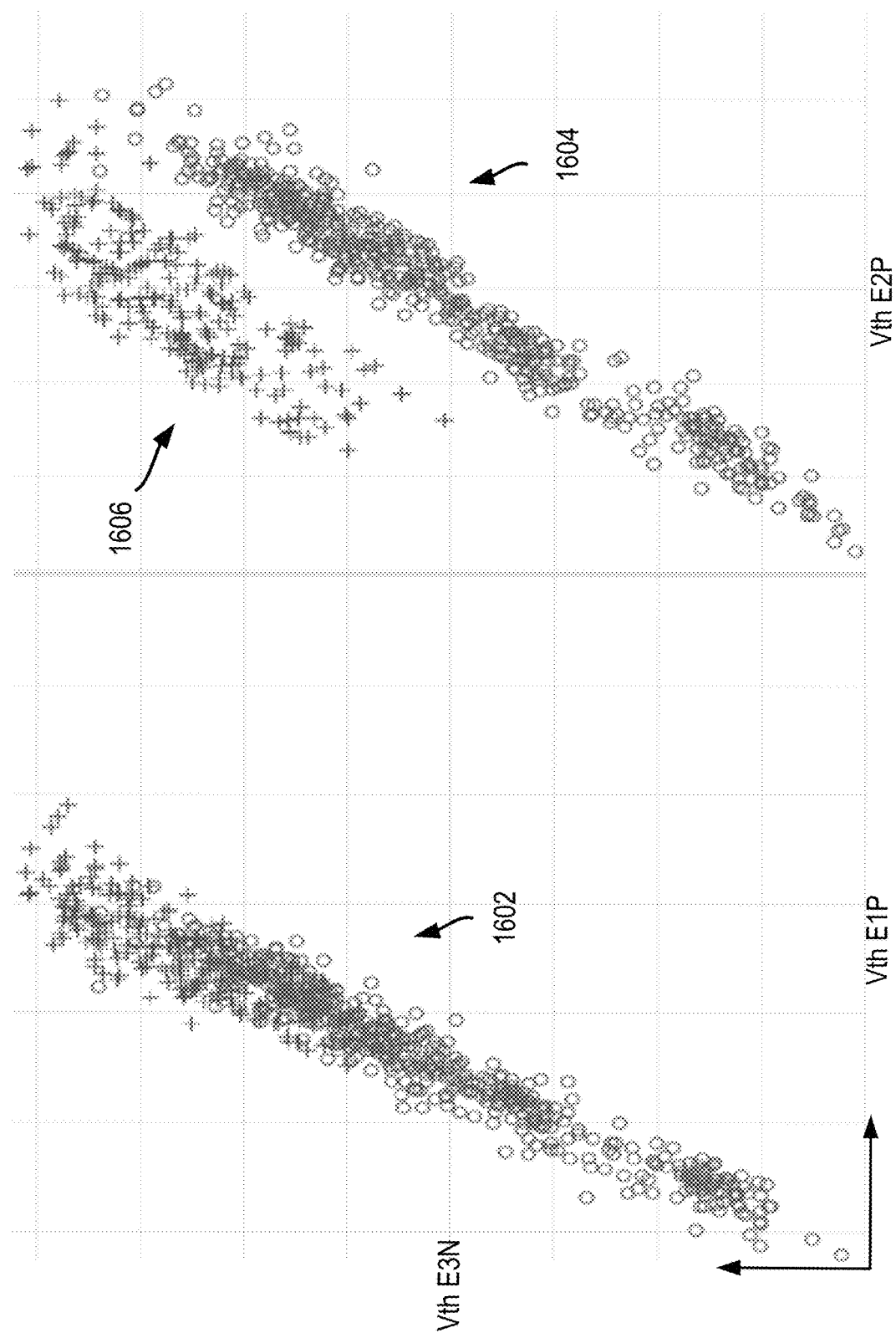
FIG. 16 is a graph that shows exemplary correlations between negative polarity threshold voltages and positive polarity threshold voltages for memory cells in a memory device, in accordance with some embodiments.

In one example, the VDM_PRE is set to a specific value to read on SET_P for distinguishing if the edge of RST_N is sufficiently negative, so VDM_PRE needs to be smaller than VDM_N times a conversion factor, where the factor is determined from the correlation between threshold voltages for SET_P and RST_N (see, e.g., the correlations of FIG. 16). In one example, VDM_N is VDM2_N.

In one example, VDM_PRE is made small enough to not threshold any SET_P bits when RST_N is beyond VDM2_N, but also large enough to make sure RST_N is far away enough from VDM2_N. In one example, VDM_PRE=VDM2_N*a conversion factor. In one example, VDM_PRE will be selected so as to include guard bands on either SET_P or RST_N sides for avoiding read disturbs.

Figure 13:
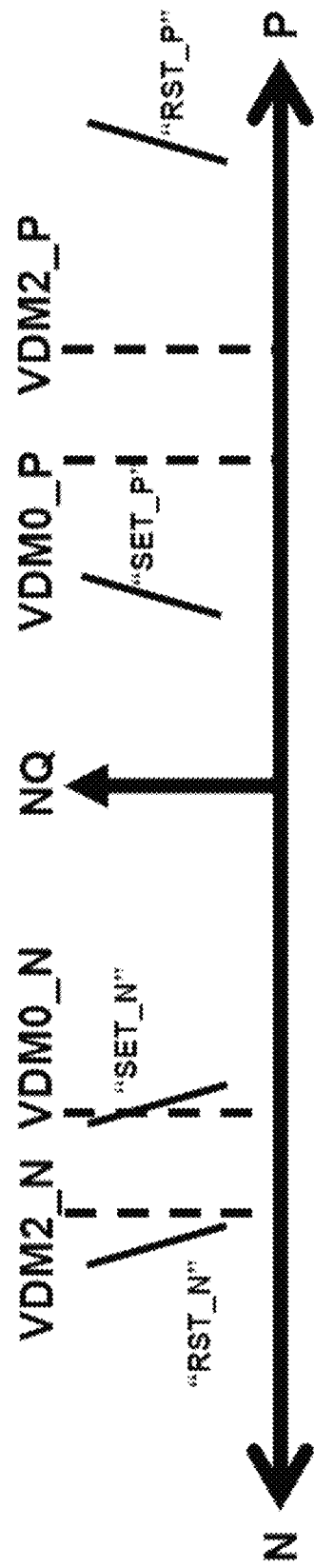

In FIG. 13, based on the pre-read evaluation above, the controller performs a read retry on negative (NEG) polarity to read correct output data from the memory cells. For example, as illustrated, read retry voltage VDM2_N is applied to the memory cells.

Figure 14:
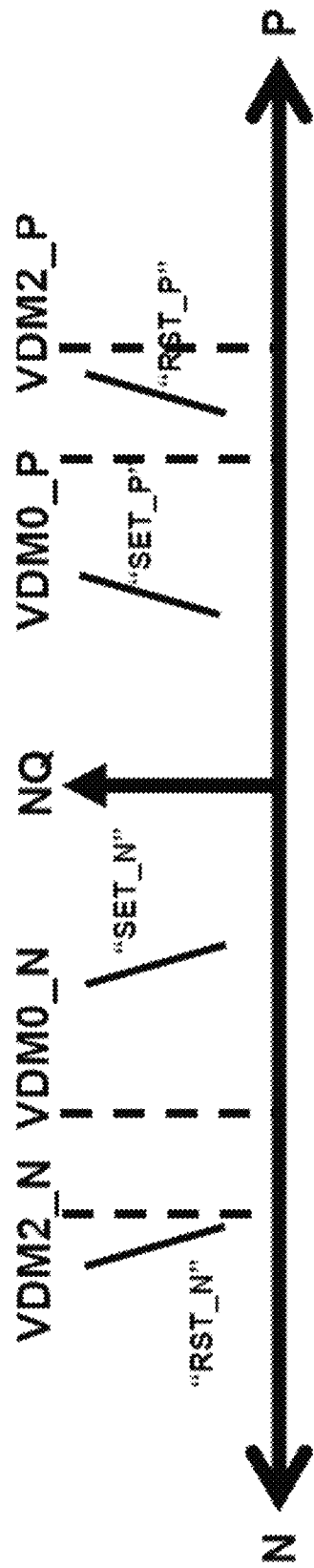

In FIG. 14, the read retry has been completed and data has been read out. The read retry above also refreshes the SET_N bits. Thus, as a result of the above process, bits in both polarities continue to be refreshed, and remain symmetric to provide sufficient margin for future reads.

Figure 15:
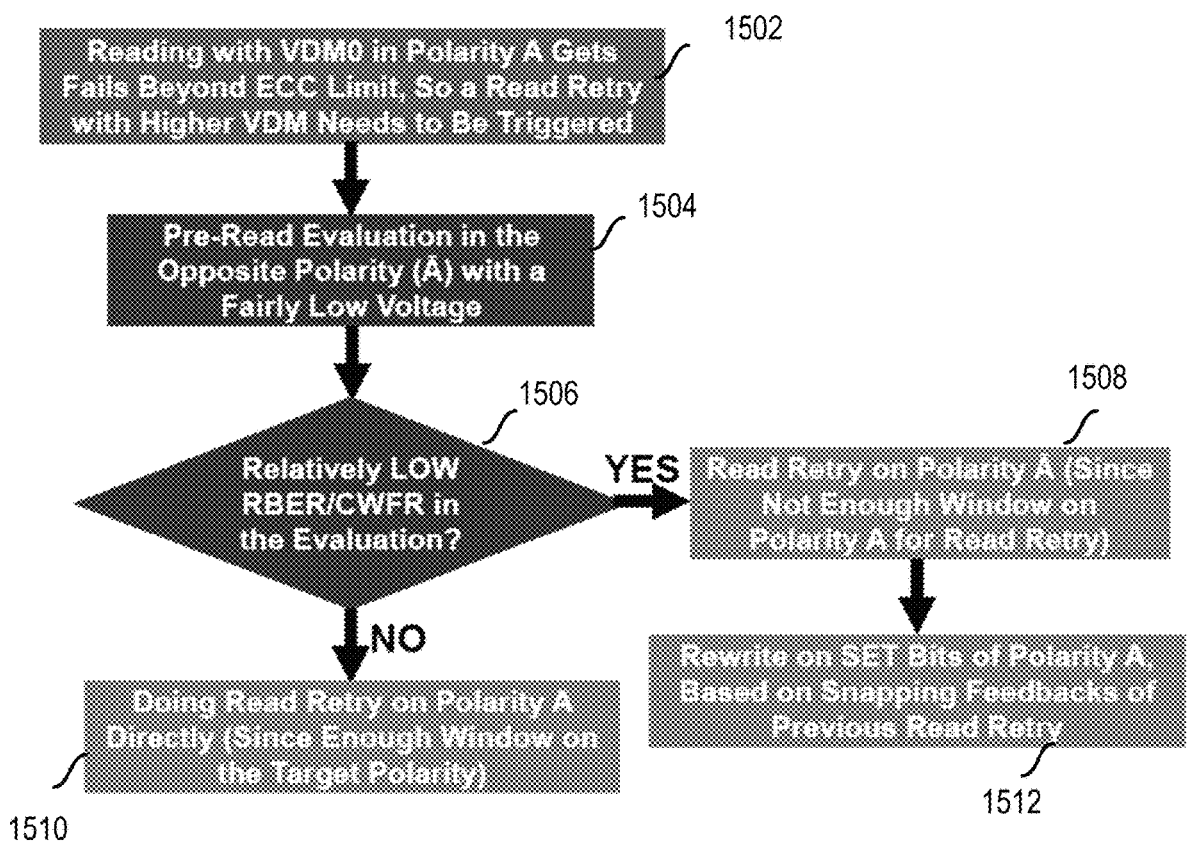
FIG. 15 shows a flowchart for applying a pre-read voltage to single-level cell (SLC) memory cells to determine a voltage polarity for a read retry operation, in accordance with some embodiments.

FIG. 15 shows a flowchart for applying a pre-read voltage to single-level cell (SLC) memory cells to determine a voltage polarity for a read retry operation, in accordance with some embodiments. In one example, the process shown in the flowchart is performed by controller 120 or controller 131.

At block 1502, a controller applies an initial read voltage in an initial polarity. The controller performs ECC processing and determines that a number of fails exceeds a predefined threshold. Based on these errors, the controller determines that a read retry with a higher read voltage should be used.

At block 1504, the controller applies a pre-read voltage in the opposite polarity with a relatively low voltage as described above to avoid snapping memory cells.

At block 1506, the controller performs a pre-read evaluation to determine if a number of errors is below threshold. In one example, the controller determines a raw bit error rate and/or a code word failure rate. If the error rate is relatively high, then processing proceeds to block 1510. If the error rate is relatively low, then processing proceeds to block 1508.

At block 1510, the read retry is done using a voltage of the same initial polarity due to read margin being sufficient.

At block 1508, the read retry is done using a voltage of the opposite polarity due to read margin being not sufficient.

At block 1512, the SET bits of the initial polarity are rewritten. The rewrite is based on snapping feedbacks from applying the read retry voltage.

FIG. 16 is a graph that shows exemplary correlations between negative polarity threshold voltages and positive polarity threshold voltages for memory cells in a memory device, in accordance with some embodiments. Data 1602 indicates a correlation between threshold voltage data for distribution edge E3_N (of RST_N) and threshold voltage data for distribution edge E1_P (of SET_P). Data 1602 is for both decks 0 and 1 of a memory device.

Similar correlations can be determined from data 1606 (deck 0) and data 1604 (deck 1), which relate threshold voltage for E3_N (of RST_N) to E2_P (of SET_P).

One or more of the above correlations can be used to determine or obtain an indication of one edge threshold voltage given the other edge threshold voltage. In various embodiments, one of the edge threshold voltages is determined from applying the pre-read voltage (e.g., VDM_PRE). A controller can then determine a polarity to select for read retry using this determined edge threshold (e.g., $V_{th}$ for E1P). For example, one or more correlations can be used in a machine learning model for which various SET_P read result data is provided as inputs to obtain a polarity output and/or a E3_N threshold voltage prediction or indication as output from the model.

In one embodiment, each correlation is optimized by deck or other physical location in a memory array, by memory die, and/or by electrical distance from a driver. Some or all of this data can be an input to the machine learning model above.

In one embodiment, $V_{th}$ of E3N has been observed to have good correlation with both E1P and E2P. So, a controller can rely on E1P errors or error rate (e.g., RBER/CWFR) of the pre-read to predict E3N margin.

Figure 17:
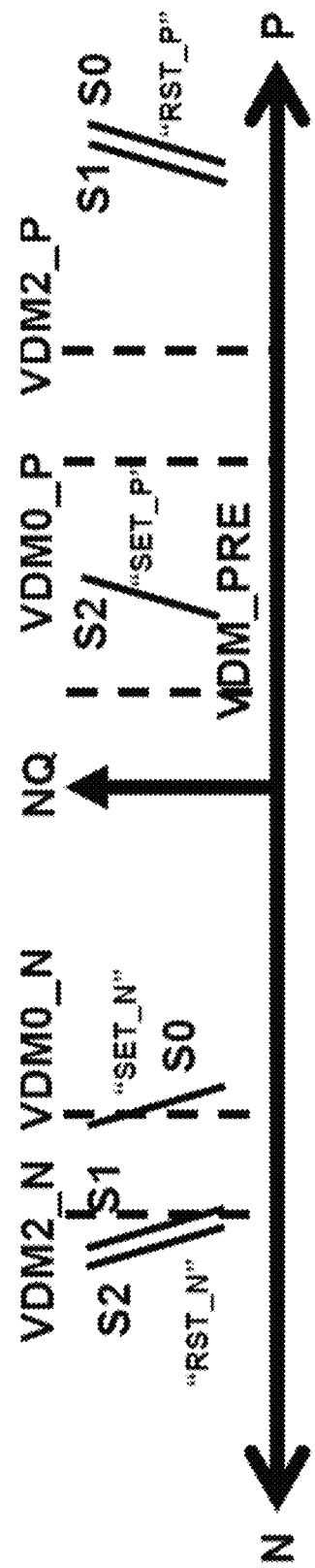
FIG. 17 shows exemplary normal quantile (NQ) threshold voltage distributions of multi-level cell (MLC) memory cells, in accordance with some embodiments.

FIG. 17 shows exemplary normal quantile (NQ) threshold voltage distributions of multi-level cell (MLC) memory cells, in accordance with some embodiments. The vertical and horizontal axes and representations of distributions use a convention similar to the above.

The illustrated MLC cell distributions correspond to three states S0, S1, S2, as shown. These states correspond to most significant bit (MSB) and least significant bit (LSB) pairs of "01", "00" and "10", as follows:

S0: "10": SET_N which is also RST_P. The state which is of low Vth on negative polarity, but high Vth on positive polarity.

S1: "00": The ternary state which is of high Vth on both positive and negative polarities.

S2: "01": RST_N, which is also SET_P. The state which is of high Vth on negative polarity, but low Vth on positive polarity.

Figure 18:
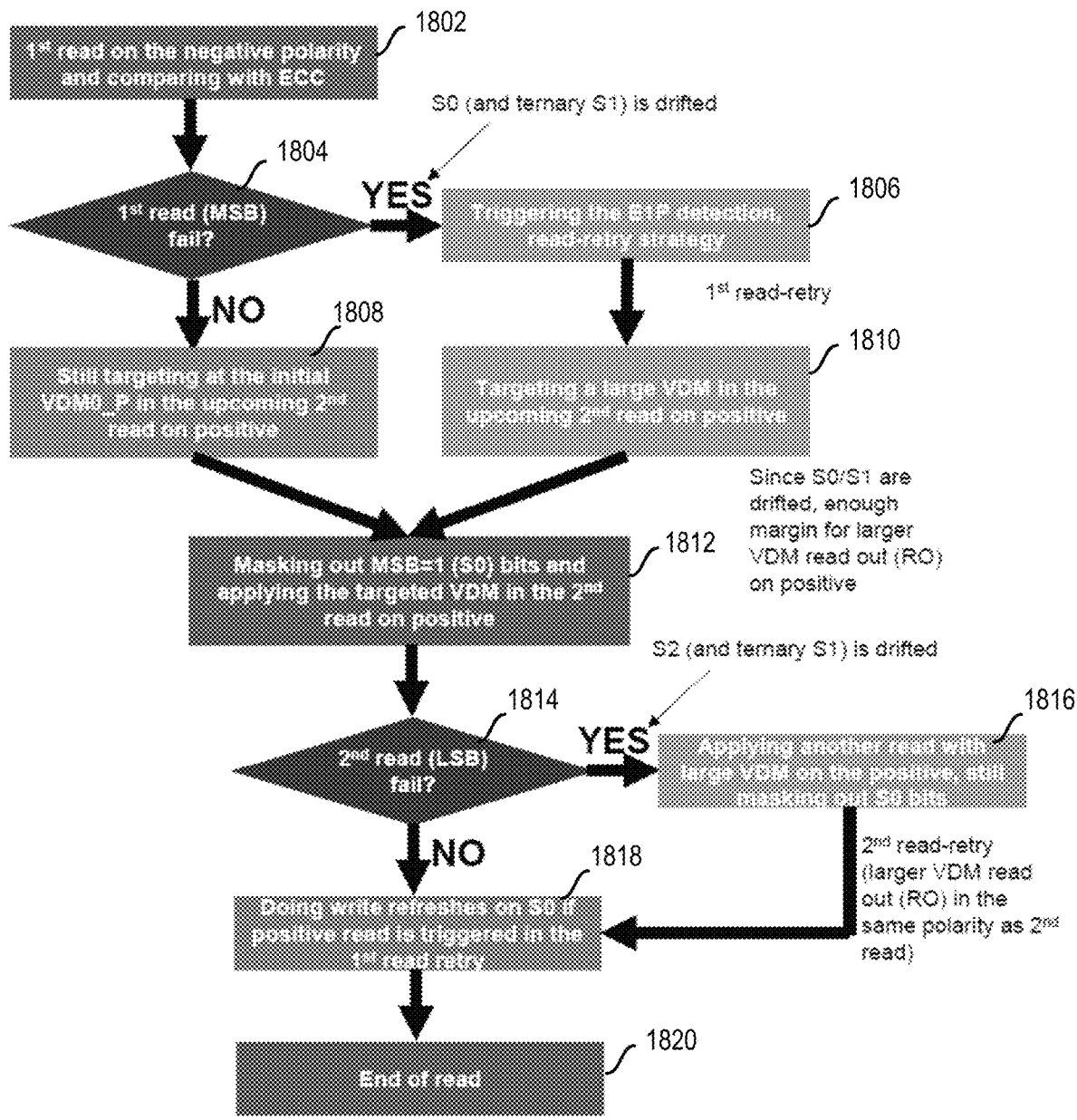
FIG. 18 shows a flowchart for applying a pre-read voltage to multi-level cell (MLC) memory cells to determine a voltage polarity for a read retry operation, in accordance with some embodiments.

FIG. 18 shows a flowchart for applying a pre-read voltage to multi-level cell (MLC) memory cells to determine a voltage polarity for a read retry operation, in accordance with some embodiments. In one example, the memory cells have distributions as shown in FIG. 17. In one example, the process shown in the flowchart is performed by controller 120 or controller 131.

Generally, as illustrated, two reads are done on the MLC cell: a first read on negative for the MSB (for S0), and a second read on positive for the LSB (to distinguish S2 and S1). Each of the first and second reads may be result in performing a read retry if the initial read fails. For the first read on negative, if a read retry is required or desired, then a polarity for the read retry voltage is selected (same polarity as initial read voltage, or opposite polarity) based on a pre-read evaluation similarly as described for FIG. 15 above. For the second read on positive, the read retry is simply performed on positive without using a pre-read evaluation.

In one embodiment, once the S0 bits in a codeword are identified, the S0 bits are masked out so that they are no longer read in the second read on positive. This helps to avoid possible read disturbs on S0 in that step.

In the second read on positive, the controller can directly use VDM2_P if VDM0_P fails. The controller does not need to decide whether to read on negative direction. Since S2_N and S1_N are both high, reading in the negative polarity would not be as good as continuing to read in positive polarity to distinguish them. The S0 bits are refreshed if the first read on negative fail is yes (a positive read is triggered in the first read retry).

Since S0 bits are not touched in the whole read on positive flow (both VDM0_P and VDM2_P would not bias onside), VDM2_P would not have been used to identify S0. S0 has already been identified in the first read on negative step. As mentioned above, S0 needs to be refreshed at the end if the first read on negative fail is yes.

At block 1802, a controller applies a first initial read voltage on negative polarity (e.g., VDM0_N) and determines errors associated with the read.

At block 1804, if the first read is a fail, then read retry is performed in block 1806. If the first read passes, then at block 1808 an initial read voltage on positive polarity (e.g., VDM0_P) is targeted for the second read on positive step in block 1812.

At block 1806, a pre-read voltage in an opposite polarity (e.g., VDM_PRE) is applied as was discussed above for SLC memory cells. The pre-read evaluation is used to select a polarity for the first read retry to determine MSB. At block 1810, a large read voltage (e.g., VDM2_P) is targeted for the second read on positive of block 1812.

At block 1812, the controller applies an initial read voltage on positive or a large read voltage on positive, depending on whether or not read retry at block 1806 was performed for the first read on negative. During the second read on positive, the MSB/S0 bits are masked out.

At block 1814, errors from the second read on positive are evaluated. If the second read fails, then another read with a larger read voltage (e.g., VDM2_P) is performed (still masking out S0 bits).

At block 1818, write refreshes are done for S0 bits if a positive read was triggered in the first read retry of block 1806.

At block 1820, the read ends, and read data is, for example, sent to a host device.

In one embodiment, a memory device uses chalcogenide MLC cells. The MSB results are compared with ECC immediately after the $1^{st}$ read on negative polarity.

A $2^{nd}$ read retry on the positive read is implemented with a larger VDM in the same polarity only to distinguish S2 and S1. The controller masks out MSB=1 ("S0") results in the $2^{nd}$ read and $2^{nd}$ read-retry after the $1^{st}$ read is clean.

The conditional rewrite of the S0 bits (e.g., block 1818) is left until the end of the read flow to minimize the latency increase. This rewrite keeps a uniform distribution of S0 after the read.

If the $1^{st}$ read passes directly, then no extra steps are needed between the $1^{st}$ and $2^{nd}$ read other than comparing with ECC and masking out S0 bits as compared to the SLC read approach described above. If either S0 or S2 is drifted, then S1 (ternary) is drifted since no read refresh exists there, leaving margins for the large VDMs needed in the $1^{st}$ and $2^{nd}$ read retries.

Figure 19:
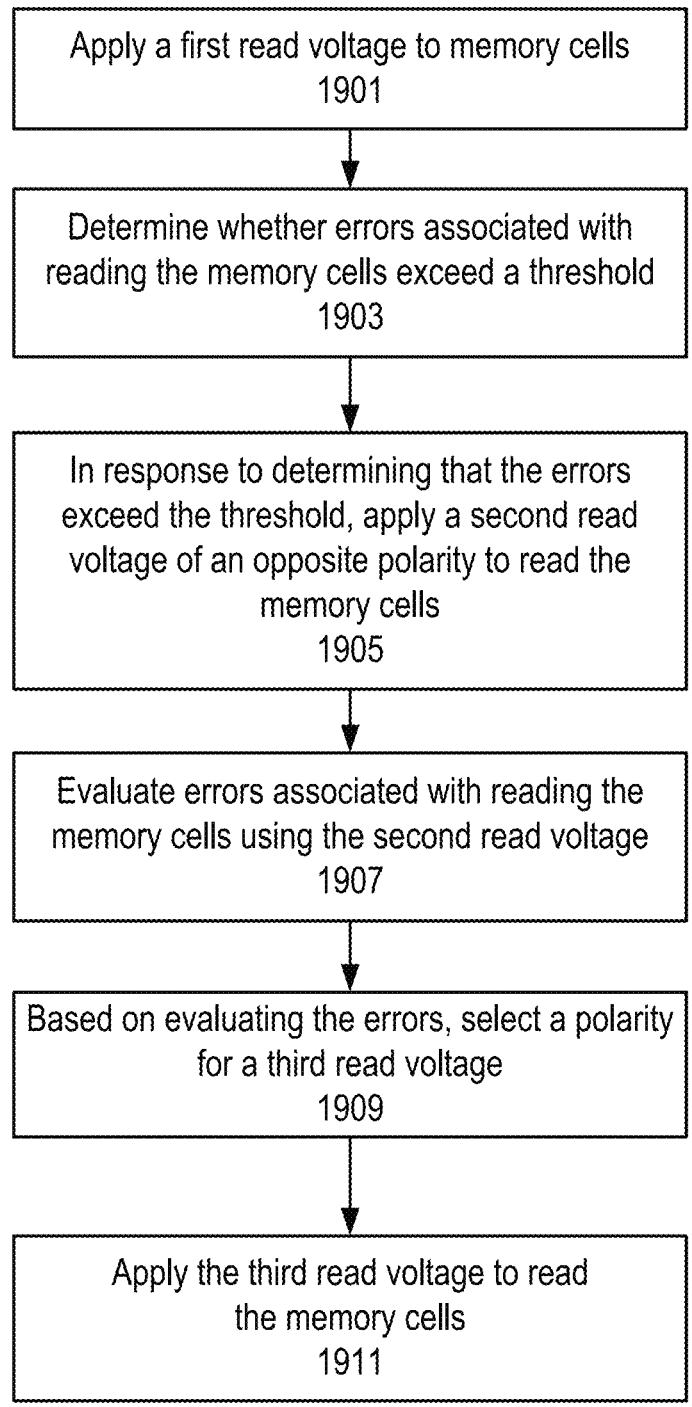
FIG. 19 shows a method for applying pre-read voltages to memory cells of a memory array when performing read operations, in accordance with some embodiments.

FIG. 19 shows a method for applying pre-read voltages to memory cells of a memory array when performing read operations, in accordance with some embodiments. For example, the method of FIG. 19 can be implemented in the system of FIG. 1.

The method of FIG. 19 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method of FIG. 19 is performed at least in part by one or more processing devices (e.g., controller 120 of FIG. 1).

Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At block 1901, a first read voltage is applied to memory cells. In one example, the first read voltage is voltage 602 of FIG. 6.

At block 1903, a determination is made whether errors associated with reading the memory cells exceed a threshold. In one example, fails beyond an ECC limit as in block 1502 of FIG. 15 are determined.

At block 1905, in response to determining that the errors exceed the threshold, a second read voltage of an opposite polarity is applied to read the memory cells. In one example, the second read voltage is voltage 606.

At block 1907, errors associated with reading the memory cells using the second read voltage are evaluated. In one example, a raw bit error rate from a pre-read evaluation are evaluated and compared against a threshold as in block 1506 of FIG. 15.

At block 1909, based on evaluating the errors associated with reading the memory cells using the second read voltage, a polarity for a third read voltage is selected. In one example, a polarity is selected as in blocks 1508 and 1510 of FIG. 15.

At block 1911, the third read voltage is applied to read the memory cells. In one example, the third read voltage is either voltage 604 or 608 depending on the selected polarity.

In one embodiment, a system comprises: a memory array (e.g., 102) including memory cells; and a controller (e.g., 120) configured to: apply a first read voltage [e.g., VDM0_N] of a first polarity [e.g., polarity A] to read the memory cells; determine first errors associated with reading the memory cells using the first read voltage; determine whether the first errors exceed a first threshold [e.g., determine whether read retry is needed]; in response to determining that the first errors exceed the first threshold, apply a second read voltage [e.g., VDM_PRE] of a second polarity [e.g., polarity A] to read the memory cells [e.g., pre-read], wherein the second polarity is opposite to the first polarity, and a magnitude of the second read voltage is less than a magnitude of the first read voltage; evaluate second errors associated with reading the memory cells using the second read voltage [e.g., pre-read evaluation]; select, based on evaluating the second errors, a third polarity, wherein the third polarity is selected to be the first polarity or the second polarity; and apply a third read voltage [e.g., VDM2_N] of the third polarity to read the memory cells.

In one embodiment, evaluating the second errors comprises determining that a number of the second errors is less than a second threshold [e.g., low error rate indicates negative margin for RST_N to SET_N is too low for read retry; not enough window]; and the third polarity is selected to be the second polarity [e.g., read retry on polarity A] based on determining that the number of the second errors is less than the second threshold.

In one embodiment, evaluating the second errors comprises determining that the number of the second errors is greater than a second threshold [e.g., high error rate indicates negative margin for RST_N to SET_N is enough for read retry; enough window]; and the third polarity is selected to be the first polarity [e.g., read retry on polarity A] based on determining that the number of the second errors is greater than the second threshold.

In one embodiment, evaluating the second errors comprises determining a raw bit error rate or a code word failure rate.

In one embodiment, the memory cells include SET bits corresponding to the first polarity [e.g., SET_A] and RESET bits corresponding to the first polarity [e.g., RST_A], and the controller is further configured to determine whether to re-write the SET bits based on the third polarity that is selected.

In one embodiment, the third polarity is selected to be the second polarity; and the controller re-writes the SET bits, but does not re-write the RESET bits.

In one embodiment, the controller re-writes the SET bits by applying a fourth voltage of the first polarity to the SET bits.

In one embodiment, the controller re-writes the SET bits based on feedback data from applying the third read voltage to the memory cells.

In one embodiment, the feedback data includes an extent of snapping by the memory cells caused by applying the third read voltage.

In one embodiment, a magnitude of the second read voltage is sufficiently low so that less than 95 to 99 percent of the memory cells snap due to applying the second read voltage.

In one embodiment, first data is read from the memory cells using the third read voltage, and the controller is configured to send the first data to a host device.

In one embodiment, the first data is read out in response to a read command received by the controller from the host device (e.g., 126).

In one embodiment, evaluating the second errors is based on a correlation between a threshold voltage characteristic of the memory cells for the first polarity and a threshold voltage characteristic of the memory cells for the second polarity.

In one embodiment, the memory cells include RESET bits corresponding to the first polarity [e.g., RST_N], and determining the first errors comprises determining a number of failures for the RESET bits.

In one embodiment, the memory cells include SET bits corresponding to the second polarity [e.g., SET_P], and evaluating the second errors comprises determining that an error rate for the SET bits is less than a second threshold [e.g., this low error rate for SET_P indicates that negative margin for RSTN to SET_N is too low for read retry].

In one embodiment, the memory cells include SET bits corresponding to the second polarity [e.g., SET_P], and evaluating the second errors comprises determining that an error rate for the SET bits is greater than a second threshold [e.g., this high error rate for SET_P indicates that negative margin for RST_N to SET_N is enough for read retry].

In one embodiment, the memory cells include SET bits corresponding to the first polarity [e.g., SET_N]; and applying the third read voltage causes the SET bits to be refreshed.

In one embodiment, the controller is further configured to perform random polarity read operations on the memory cells.

In one embodiment, each memory cell (e.g., 402) comprises chalcogenide.

In one embodiment, each memory cell further comprises a top carbon electrode above the chalcogenide, and a bottom carbon electrode below the chalcogenide.

In one embodiment, a method comprises: applying a first read voltage [e.g., VDM0_N] of a first polarity [e.g., polarity A] to read memory cells in a memory device; determining first errors associated with reading the memory cells using the first read voltage; determining whether the first errors exceed a first threshold [e.g., determine whether read retry is needed]; in response to determining that the first errors exceed the first threshold, applying a second read voltage [e.g., VDM_PRE] of a second polarity [e.g., polarity A] to read the memory cells [e.g., pre-read], wherein the second polarity is opposite to the first polarity, and a magnitude of the second read voltage is less than a magnitude of the first read voltage; evaluating second errors associated with reading the memory cells using the second read voltage [e.g., pre-read evaluation]; selecting, based on evaluating the second errors, a third polarity, wherein the third polarity is selected to be the first polarity or the second polarity; and applying a third read voltage [e.g., VDM2_N] of the third polarity to read the memory cells.

In one embodiment, the magnitude of the second read voltage is less than or equal to the magnitude of the third read voltage multiplied by a conversion factor [e.g., VDM2_N*conversion factor].

In one embodiment, the conversion factor is based on a correlation between a threshold voltage characteristic of the memory cells for the first polarity and a threshold voltage characteristic of the memory cells for the second polarity.

In one embodiment, the magnitude of the second read voltage is less than or equal to the magnitude of the first read voltage multiplied by a conversion factor [e.g., VDM0_N*conversion factor].

In one embodiment, the method further comprises receiving, by a controller of the memory device, a read command from a host device. The third read voltage is applied to read the memory cells to obtain first data in response to receiving the read command, and the first data is sent to the host device.

In one embodiment, an apparatus comprises: memory; and a controller configured to: apply a first voltage [e.g., VDM0_N] of a first polarity [e.g., polarity A] to read the memory; based on a result from reading the memory, determine whether to perform a read retry; in response to determining to perform the read retry, apply a second voltage [e.g., VDM_PRE] of a second polarity [e.g., polarity A] to read the memory [e.g., pre-read], wherein the second polarity is opposite to the first polarity; select a third polarity, wherein the third polarity is selected to be the first polarity or the second polarity based on a result from the read retry; and apply a third voltage [e.g., VDM2_N] of the third polarity to read the memory.

In one embodiment, a magnitude of the second voltage is less than a magnitude of the first voltage.

The disclosure includes various devices which perform the methods and implement the systems described above, including data processing systems which perform these methods, and computer-readable media containing instructions which when executed on data processing systems cause the systems to perform these methods.

The description and drawings are illustrative and are not to be construed as limiting. Numerous specific details are described to provide a thorough understanding. However, in certain instances, well-known or conventional details are not described in order to avoid obscuring the description. References to one or an embodiment in the present disclosure are not necessarily references to the same embodiment; and, such references mean at least one.

As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

Reference in this specification to "one embodiment" or "an embodiment" means that a particular feature, structure, or characteristic described in connection with the embodiment is included in at least one embodiment of the disclosure. The appearances of the phrase "in one embodiment" in various places in the specification are not necessarily all referring to the same embodiment, nor are separate or alternative embodiments mutually exclusive of other embodiments. Moreover, various features are described which may be exhibited by some embodiments and not by others. Similarly, various requirements are described which may be requirements for some embodiments but not other embodiments.

In this description, various functions and/or operations may be described as being performed by or caused by software code to simplify description. However, those skilled in the art will recognize what is meant by such expressions is that the functions and/or operations result from execution of the code by one or more processing devices, such as a microprocessor, Application-Specific Integrated Circuit (ASIC), graphics processor, and/or a Field-Programmable Gate Array (FPGA). Alternatively, or in combination, the functions and operations can be implemented using special purpose circuitry (e.g., logic circuitry), with or without software instructions. Embodiments can be implemented using hardwired circuitry without software instructions, or in combination with software instructions. Thus, the techniques are not limited to any specific combination of hardware circuitry and software, nor to any particular source for the instructions executed by a computing device.

While some embodiments can be implemented in fully functioning computers and computer systems, various embodiments are capable of being distributed as a computing product in a variety of forms and are capable of being applied regardless of the particular type of computer-readable medium used to actually effect the distribution.

At least some aspects disclosed can be embodied, at least in part, in software. That is, the techniques may be carried out in a computing device or other system in response to its processing device, such as a microprocessor, executing sequences of instructions contained in a memory, such as ROM, volatile RAM, non-volatile memory, cache or a remote storage device.

Routines executed to implement the embodiments may be implemented as part of an operating system, middleware, service delivery platform, SDK (Software Development Kit) component, web services, or other specific application, component, program, object, module or sequence of instructions (sometimes referred to as computer programs). Invocation interfaces to these routines can be exposed to a software development community as an API (Application Programming Interface). The computer programs typically comprise one or more instructions set at various times in various memory and storage devices in a computer, and that, when read and executed by one or more processors in a computer, cause the computer to perform operations necessary to execute elements involving the various aspects.

A computer-readable medium can be used to store software and data which when executed by a computing device causes the device to perform various methods. The executable software and data may be stored in various places including, for example, ROM, volatile RAM, non-volatile memory and/or cache. Portions of this software and/or data may be stored in any one of these storage devices. Further, the data and instructions can be obtained from centralized servers or peer to peer networks. Different portions of the data and instructions can be obtained from different centralized servers and/or peer to peer networks at different times and in different communication sessions or in a same communication session. The data and instructions can be obtained in entirety prior to the execution of the applications. Alternatively, portions of the data and instructions can be obtained dynamically, just in time, when needed for execution. Thus, it is not required that the data and instructions be on a computer-readable medium in entirety at a particular instance of time.

Examples of computer-readable media include, but are not limited to, recordable and non-recordable type media such as volatile and non-volatile memory devices, read only memory (ROM), random access memory (RAM), flash memory devices, solid-state drive storage media, removable disks, magnetic disk storage media, optical storage media (e.g., Compact Disk Read-Only Memory (CD ROMs), Digital Versatile Disks (DVDs), etc.), among others. The computer-readable media may store the instructions. Other examples of computer-readable media include, but are not limited to, non-volatile embedded devices using NOR flash or NAND flash architectures. Media used in these architectures may include un-managed NAND devices and/or managed NAND devices, including, for example, eMMC, SD, CF, UFS, and SSD.

In general, a non-transitory computer-readable medium includes any mechanism that provides (e.g., stores) information in a form accessible by a computing device (e.g., a computer, mobile device, network device, personal digital assistant, manufacturing tool having a controller, any device with a set of one or more processors, etc.). A "computer-readable medium" as used herein may include a single medium or multiple media (e.g., that store one or more sets of instructions).

In various embodiments, hardwired circuitry may be used in combination with software and firmware instructions to implement the techniques. Thus, the techniques are neither limited to any specific combination of hardware circuitry and software nor to any particular source for the instructions executed by a computing device.

Various embodiments set forth herein can be implemented using a wide variety of different types of computing devices. As used herein, examples of a "computing device" include, but are not limited to, a server, a centralized computing platform, a system of multiple computing processors and/or components, a mobile device, a user terminal, a vehicle, a personal communications device, a wearable digital device, an electronic kiosk, a general purpose computer, an electronic document reader, a tablet, a laptop computer, a smartphone, a digital camera, a residential domestic appliance, a television, or a digital music player. Additional examples of computing devices include devices that are part of what is called "the internet of things" (IOT). Such "things" may have occasional interactions with their owners or administrators, who may monitor the things or modify settings on these things. In some cases, such owners or administrators play the role of users with respect to the "thing" devices. In some examples, the primary mobile device (e.g., an Apple iPhone) of a user may be an administrator server with respect to a paired "thing" device that is worn by the user (e.g., an Apple watch).

In some embodiments, the computing device can be a computer or host system, which is implemented, for example, as a desktop computer, laptop computer, network server, mobile device, or other computing device that includes a memory and a processing device. The host system can include or be coupled to a memory sub-system so that the host system can read data from or write data to the memory sub-system. The host system can be coupled to the memory sub-system via a physical host interface. In general, the host system can access multiple memory sub-systems via a same communication connection, multiple separate communication connections, and/or a combination of communication connections.

In some embodiments, the computing device is a system including one or more processing devices. Examples of the processing device can include a microcontroller, a central processing unit (CPU), special purpose logic circuitry (e.g., a field programmable gate array (FPGA), an application specific integrated circuit (ASIC), etc.), a system on a chip (SoC), or another suitable processor.

In one example, a computing device is a controller of a memory system. The controller includes a processing device and memory containing instructions executed by the processing device to control various operations of the memory system.

Although some of the drawings illustrate a number of operations in a particular order, operations which are not order dependent may be reordered and other operations may be combined or broken out. While some reordering or other groupings are specifically mentioned, others will be apparent to those of ordinary skill in the art and so do not present an exhaustive list of alternatives. Moreover, it should be recognized that the stages could be implemented in hardware, firmware, software or any combination thereof.

In the foregoing specification, the disclosure has been described with reference to specific exemplary embodiments thereof. It will be evident that various modifications may be made thereto without departing from the broader spirit and scope as set forth in the following claims. The specification and drawings are, accordingly, to be regarded in an illustrative sense rather than a restrictive sense.

What is claimed is:

1. A system comprising:
a memory array including memory cells; and
a controller configured to:
apply a first read voltage of a first polarity to read the memory cells;
determine first errors associated with reading the memory cells using the first read voltage;
determine whether the first errors exceed a first threshold;
in response to determining that the first errors exceed the first threshold, apply a second read voltage of a second polarity to read the memory cells, wherein the second polarity is opposite to the first polarity, and a magnitude of the second read voltage is less than a magnitude of the first read voltage;
evaluate second errors associated with reading the memory cells using the second read voltage;
select, based on evaluating the second errors, a third polarity, wherein the third polarity is selected to be the first polarity or the second polarity; and
apply a third read voltage of the third polarity to read the memory cells.

2. The system of claim 1, wherein:
evaluating the second errors comprises determining that a number of the second errors is less than a second threshold; and
the third polarity is selected to be the second polarity based on determining that the number of the second errors is less than the second threshold.

3. The system of claim 1, wherein:
evaluating the second errors comprises determining that the number of the second errors is greater than a second threshold; and
the third polarity is selected to be the first polarity based on determining that the number of the second errors is greater than the second threshold.

4. The system of claim 1, wherein evaluating the second errors comprises determining a raw bit error rate or a code word failure rate.

5. The system of claim 1, wherein the memory cells include SET bits corresponding to the first polarity and RESET bits corresponding to the first polarity, and the controller is further configured to determine whether to re-write the SET bits based on the third polarity that is selected.

6. The system of claim 5, wherein:
the third polarity is selected to be the second polarity; and
the controller re-writes the SET bits, but does not re-write the RESET bits.

7. The system of claim 6, wherein the controller re-writes the SET bits by applying a fourth voltage of the first polarity to the SET bits.

8. The system of claim 7, wherein the controller re-writes the SET bits based on feedback data from applying the third read voltage to the memory cells.

9. The system of claim 8, wherein the feedback data includes an extent of snapping by the memory cells caused by applying the third read voltage.

10. The system of claim 1, wherein a magnitude of the second read voltage is sufficiently low so that less than 95 to 99 percent of the memory cells snap due to applying the second read voltage.

11. The system of claim 1, wherein first data is read from the memory cells using the third read voltage, and the controller is configured to send the first data to a host device.

12. The system of claim 11, wherein the first data is read out in response to a read command received by the controller from the host device.

13. The system of claim 1, wherein evaluating the second errors is based on a correlation between a threshold voltage characteristic of the memory cells for the first polarity and a threshold voltage characteristic of the memory cells for the second polarity.

14. The system of claim 1, wherein the memory cells include RESET bits corresponding to the first polarity, and determining the first errors comprises determining a number of failures for the RESET bits.

15. The system of claim 1, wherein the memory cells include SET bits corresponding to the second polarity, and evaluating the second errors comprises determining that an error rate for the SET bits is less than a second threshold.

16. The system of claim 1, wherein the memory cells include SET bits corresponding to the second polarity, and evaluating the second errors comprises determining that an error rate for the SET bits is greater than a second threshold.

17. The system of claim 1, wherein:
the memory cells include SET bits corresponding to the first polarity; and
applying the third read voltage causes the SET bits to be refreshed.

18. The system of claim 1, wherein the controller is further configured to perform random polarity read operations on the memory cells.

19. The system of claim 1, wherein each memory cell comprises chalcogenide.

20. The system of claim 19, wherein each memory cell further comprises a top carbon electrode above the chalcogenide, and a bottom carbon electrode below the chalcogenide.

21. A method comprising:
applying a first read voltage of a first polarity to read memory cells in a memory device;
determining first errors associated with reading the memory cells using the first read voltage;
determining whether the first errors exceed a first threshold;
in response to determining that the first errors exceed the first threshold, applying a second read voltage of a second polarity to read the memory cells, wherein the second polarity is opposite to the first polarity, and a magnitude of the second read voltage is less than a magnitude of the first read voltage;
evaluating second errors associated with reading the memory cells using the second read voltage;
selecting, based on evaluating the second errors, a third polarity, wherein the third polarity is selected to be the first polarity or the second polarity; and
applying a third read voltage of the third polarity to read the memory cells.

22. The method of claim 21, wherein the magnitude of the second read voltage is less than or equal to the magnitude of the third read voltage multiplied by a conversion factor.

23. The method of claim 22, wherein the conversion factor is based on a correlation between a threshold voltage characteristic of the memory cells for the first polarity and a threshold voltage characteristic of the memory cells for the second polarity.

24. The method of claim 21, wherein the magnitude of the second read voltage is less than or equal to the magnitude of the first read voltage multiplied by a conversion factor.

25. The method of claim 21, further comprising:
receiving, by a controller of the memory device, a read command from a host device;
wherein the third read voltage is applied to read the memory cells to obtain first data in response to receiving the read command, and the first data is sent to the host device.

26. An apparatus comprising:
memory; and
a controller configured to:
apply a first voltage of a first polarity to read the memory;
based on a result from reading the memory, determine whether to perform a read retry;
in response to determining to perform the read retry, apply a second voltage of a second polarity to read the memory, wherein the second polarity is opposite to the first polarity;
select a third polarity, wherein the third polarity is selected to be the first polarity or the second polarity based on a result from the read retry; and
apply a third voltage of the third polarity to read the memory.

27. The apparatus of claim 26, wherein a magnitude of the second voltage is less than a magnitude of the first voltage.

* * * * *